United States Patent [19]

Miyake et al.

[11] Patent Number: 5,182,625

[45] Date of Patent: Jan. 26, 1993

[54] IMAGE SENSOR AND METHOD OF MANUFACTURING THE SAME

[75] Inventors: Hiroyuki Miyake; Tsutomu Abe; Hisao Ito; Hiroyuki Hotta; Yasumoto Shimizu; Yoshihiko Sakai, all of Kanagawa, Japan

[73] Assignee: Fuji Xerox Co., Ltd., Tokyo, Japan

[21] Appl. No.: 691,517

[22] Filed: Apr. 25, 1991

[30] Foreign Application Priority Data

| Apr. 26, 1990 | [JP] | Japan | 2-108920 |
|---|---|---|---|
| Apr. 26, 1990 | [JP] | Japan | 2-108921 |
| May 8, 1990 | [JP] | Japan | 2-116870 |
| May 16, 1990 | [JP] | Japan | 2-125746 |

[51] Int. Cl.$^5$ .................... H01L 27/14; H01L 31/00
[52] U.S. Cl. .................... 257/443; 257/448
[58] Field of Search ............ 357/30 H, 30 Q, 30 G, 357/31, 32, 71; 250/578.1, 211 R; 358/213.15, 213.11, 213.18

[56] References Cited

U.S. PATENT DOCUMENTS

| 4,763,189 | 8/1988 | Komatsu et al. | 357/30 H |
| 4,870,293 | 9/1989 | Elabd | 357/30 H |
| 4,958,222 | 9/1990 | Takakura et al. | 357/53 |
| 5,027,176 | 6/1991 | Saika et al. | 357/30 |

Primary Examiner—Andrew J. James
Assistant Examiner—Sara W. Crane
Attorney, Agent, or Firm—Finnegan, Henderson, Farabow, Garrett and Dunner

[57] ABSTRACT

An image sensor having an photodetecting element array including a plurality of blocks linearly arrayed in a main scan direction, each block consisting of a plurality of photodetecting elements, a plurality of switching elements for transferring every block charges generated in the photodetecting elements, and drive ICs for outputting the charges in the form of image signals. In the image sensor, the switching elements in a block of the photodetecting element array and the switching elements in another block located adjacent to the former block are connected by wires in such a way that the switching elements closest to each other between the blocks are interconnected, the switching elements next close to each other are interconnected, and so on. The wires connecting from the switching elements in a block to the switching elements in blocks on both sides of the former block are disposed oppositely with respect to the main scan direction, and are disclosed in such a way that the shortest wire connecting the switching elements is located closest to the photodetecting element array, the next short wire is located next close to the photodetecting element array, and so on.

6 Claims, 23 Drawing Sheets

COM1

| 1ST BLOCK | 2ND BLOCK | 3RD BLOCK | --- | N-2-TH BLOCK | N-1-TH BLOCK | N-TH BLOCK |
|---|---|---|---|---|---|---|
| 1-n BITS | 1-n BITS | 1-n BITS | | 1-n BITS | 1-n BITS | 1-n BITS |
| → | ← | → | --- | ← | → | ← |

COM2

| 1ST BLOCK | 2ND BLOCK | 3RD BLOCK | --- | N-2-TH BLOCK | N-1-TH BLOCK | N-TH BLOCK |
|---|---|---|---|---|---|---|
| 1-n BITS | 1-n BITS | 1-n BITS | | 1-n BITS | 1-n BITS | 1-n BITS |
| ← | → | ← | --- | → | ← | → |

COM

| 1ST BLOCK | 2ND BLOCK | 3RD BLOCK | --- | N-2-TH BLOCK | N-1-TH BLOCK | N-TH BLOCK |
|---|---|---|---|---|---|---|
| 1-n BITS | 1-n BITS | 1-n BITS | | 1-n BITS | 1-n BITS | 1-n BITS |
| → | → | → | --- | → | → | → |

IMAGE SENSOR AND METHOD OF MANUFACTURING THE SAME

BACKGROUND OF THE INVENTION

The present invention relates to an image sensor used for facsimile machines, scanners or the like and a method of manufacturing the same, and more particularly to an image sensor having a wiring structure with a less electrical influence among interconnection wires, and a method of manufacturing the same.

In the conventional image sensors, particularly close-contact type image sensors, there is known an image sensor of the type in which image data of documents, for example, is projected onto the sensor in a one-to-one correspondence and the projected image is converted into electrical signals. A TFT drive image sensor belonging to the category of this type of the image sensor has been used. In the TFT drive image sensor, the projected image is divided into a great number of picture elements (photodetecting elements), electric charges generated in the photodetecting elements are temporarily stored every specific block of photodetecting elements in the capacitors existing between the wires by using thin film transistor switching elements, and the charges are time-sequentially read out of the capacitors in the form of electrical signals at a speed of several hundreds kHz to several MHz. In the TFT drive image sensor, the image can be read using a single drive IC, through the action of the TFTs. Therefore, the number of drive ICs for driving the image sensor can be reduced.

The TFT drive image sensor, as shown in FIG. 1 showing an equivalent circuit of the image sensor, is made up of a linear photodetecting element array 51 having a length substantially equal to the width of a document, a charge transfer section 52 consisting of a plurality of thin film transistors $T_{i,j}$ ($i=1$ to N, $j=1$ to n) provided in association with photodetecting elements 51" in a one-to-one correspondence, and a matrix-arrayed multilayered wiring structure 53.

The photodetecting element array 51 is divided into photodetecting element groups of N number of blocks. The "n" number of photodetecting elements 51" forming one group may be equivalently expressed by photo diodes $P_{i,j}$ ($i=1$ to N, $j=1$ to n). The photodetecting elements 51" are respectively connected to the drain electrodes of the thin film transistors $T_{i,j}$. The source electrodes of the thin film transistors $T_{i,j}$ are respectively connected, every group of photodetecting elements in the block, to the "n" number of common signal lines 54 through the multilayered wiring structure 53. The signal lines 54 are connected to a drive IC 55.

The gate electrodes of the thin film transistors $T_{i,j}$ are connected to a gate pulse generator 56 so that the transistors are turned on every block. The electric charges generated in the photodetecting elements 51" are stored, for a predetermined period of time, in the parasitic capacitors of the photodetecting elements and the overlap capacitors between the drain and gate electrodes of thin film transistors. Then, the charges are sequentially transferred every block to the wiring capacitors $C_i$ ($i=1$ to n) of the multilayered wiring structure 53. During the charge transfer, the thin film transistors $T_{i,j}$ serve as charge transfer switches.

A gate pulse $\phi G1$ is transferred from the gate pulse generator 56 through the gate signal lines $G_i$ ($i=1$ to n) to the thin film transistors $T_{1,1}$ to $T_{1,n}$ of the first block, to turn them on. The charges generated in the photodetecting elements 51" of the first block are transferred to and stored in the wiring capacitors $C_i$. By the charges stored in the wiring capacitors $C_i$, the potentials in the common signal lines 54 vary. The varied voltages are time-sequentially introduced onto an output line 57 by successively turning on analog switches $SW_i$ ($i=1$ to n) in the drive IC 55.

In response to the gate pulses $\phi G2$ to $\phi Gn$, the transistors $T_{2,1}$ to $T_{2,n}$ to $T_{N,1}$ to $T_{N,n}$ in the second to N-th blocks are turned on, so that the charges of the photodetecting elements are transferred every block, thereby obtaining an image signal for one line in the main scan direction on an original document. The original is moved by means of a document feed means (not shown), such as rollers, and the sequence of the operations as stated above is repeated. Finally, image signals of the whole document are obtained (Japanese Patent Unexamined Publication No. Sho. 63-9358).

The construction of the matrix-arrayed multilayered wiring structure 53 is shown in FIGS. 2 and 3. FIG. 2 is a plan view showing the construction of the wiring structure, and FIG. 3 is a cross sectional view showing the same. As shown, the multilayered wiring structure 53 is constructed with a substrate 21, a lower layer signal line 31, an insulating layer 33, and an upper layer signal line 32. In the structure, the signal line 31, the insulating layer 33 and the signal line 32 are multilayered on the substrate 21. The signal lines 31 and 32 are arranged crossing each other. Contact holes 34 are provided for interconnection of the upper and lower signal lines.

As described, in the construction of the conventional image sensor, the multilayered wiring structure has the matrix construction such that the upper and lower signal lines cross each other with the insulating layer 33 being interlayered therebetween, as shown in FIG. 3. Accordingly, a coupling capacitor exits at each cross portion of the lower and upper layer signal lines 31 and 32. The coupling capacitor causes a potential difference between the upper and the lower lines at each cross portion. The output signal of one of the signal lines is influenced by the output signal of the other. Cross talk occurs thereat, the charges are mistakenly read, and hence the reproduction for gradation in the image sensor is deteriorated.

The image sensor as described above is a monochromatic image sensor. A TFT drive color image sensor having the matrix-arrayed multilayered wiring structure also has similar problems.

The construction and operation of the TFT drive color image sensor having the matrix-arrayed multilayered wiring structure will be described with reference to FIG. 4 showing an equivalent circuit of the color image sensor. In FIG. 4, like or equivalent portions are designated by the same reference symbols as in FIG. 1.

As shown in FIG. 4, in the color image sensor, "n" number of sandwich type photodetecting elements (photo diodes P) arrayed on an insulating substrate made of glass, for example, are grouped into a block. N number of blocks make up a photodetecting element array 51 (consisting of photo diodes $P_{1,1}$ to $P_{N,n}$). Three lines of photodetecting element arrays 51a, 51b and 51c are arranged in the subsidiary scan direction. The array 51a is coupled with a red (R) passing filter. The array 51b is coupled with a green (G) passing filter. The array 51c is coupled with a blue (B) passing filter.

The color image sensor further includes charge transfer section 52 consisting of thin film transistors T1,1 to TN,n connected to the photodetecting elements 51″, a matrix-layered multilayered wiring structure 53, "n" number of common signal lines 54, which are led from the charge transfer section 52 through the multilayered wiring structure 53, corresponding to each group of the photodetecting elements of each block, and analog switches SW1 to SWn provided in a drive IC 55 and connected to the common signal lines 54.

The first ends of the photodetecting elements 51″ receive voltages VB1, VB2, and VB3 through common electrodes provided for the photodetecting element arrays. The wires, which are led from the source electrodes of the thin film transistors (TFTs) of the charge transfer section 52, which are connected to the photodetecting elements 51″ in the array 51a of the first line, are connected to the source electrodes of the thin film transistors connecting to the photodetecting elements 51″ in the arrays 51b and 51c of the second and third lines. The wires are connected as common wires to the matrix-layered multilayered wire structure 53, that is, to the common signal lines 54 whose number is equal to that of the photodetecting elements 51″ in the block of the photodetecting element array 51. The gate electrodes of the thin film transistors of the photodetecting element arrays 51 are connected every block, and accordingly gate terminals GR1 to GRN, GG1 to GGN, and GB1 to GBN are provided corresponding to the three lines of the photodetecting element arrays 51a, 51b and 51c.

A method of driving the color image sensor will be described. When an original document (not shown) put on the photodetecting element arrays 51 is illuminated with light from a light source (not shown), the reflected light illuminates the photodetecting elements 51″ (photodiode P) of the photodetecting element arrays of the respective lines, to cause the photodetecting elements to generate charges according to the light and shade, and color on the original. The generated charges are stored in the parasitic capacitors of the photodetecting elements 51″ and the overlap capacitors between the drain and gate electrodes of TFTs. The photodetecting element arrays 51a, 51b, and 51c are coupled with the color filters allowing the specific colors (red, green, and blue) to pass therethrough. Accordingly, the first photodetecting element array 51a responds to red to generate charges; the second photodetecting element array 51b responds to green to generate charges; the third photodetecting element array 51c responds to blue to generate charges.

When the TFT is turned on in response to a gate pulse $\phi G$ from a gate pulse generator (not shown), the photodiode P is connected to the common signal line 54, so that the charges stored in the parasitic capacitor and the like are transferred to and stored in wiring capacitors C1 to Cn of the multilayered wiring 53. More specifically, when charges are generated in the photo diodes P1,1 to P1,n in the first block of the first photodetecting element array (responsive to red) 51a, the transistors T1,1 to T1,n are turned on in response to a gate pulse $\phi G1$ from the gate pulse generator. Charges generated in the photo diodes P1,1 to P1,n are transferred to and stored in the wiring capacitors C1 to Cn in the matrix-arrayed multilayered wiring structure 53. Afterwards, the transistors T1,1 to T1,n are turned off. In the above case, since the wiring capacitor (Ci) is 100 times as large as the parasitic capacitor of the photodiode P in capacitance, it is not necessary to reset the photodiode P.

A timing generator (not shown) successively applies read switching signals $\phi s1$ to $\phi sn$ to the switches SW1 to SWn in the drive IC 55. After one timing, the timing generator likewise applies reset switching signals $\phi R1$ to $\phi Rn$ to reset switching elements RS1 to RSn of the drive IC. Consequently, the charges stored in the wiring capacitors C1 to Cn are outputted (COM) in the form of image signals. Subsequently, charges generated in the photo diodes in the next block are transferred. Following the read operation the first photodetecting element array (responsive to red) 51a, the read operation is performed for the second photodetecting element array (responsive to green) 51b, and finally the read operation is performed for the third photodetecting element array (responsive to blue) 51c.

The image signals (image data) read from the first to third photodetecting elements 51a to 51c are stored into a memory outside the image sensor. The pitches of the photodetecting elements of the photodetecting element arrays are calculated and the image data are composed on the calculation result.

As described above, also in the TFT drive color image sensor with a matrix-arrayed multilayered wiring structure, cross talk occurs thereat, the charges are mistakenly read, and hence the reproduction for gradation in the image sensor is deteriorated.

SUMMARY OF THE INVENTION

The present invention has been made in view of the above circumstances and has as an object to provide an image sensor which minimizes the electrical interference among the signal lines and hence can exactly output charges from signal lines.

Another object of the present invention is to provide a method of efficiently manufacturing the image sensor.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects, an image sensor according to the invention comprises: a photodetecting element array including a plurality of blocks linearly arrayed in a main scan direction, each block consisting of a plurality of photodetecting elements, a plurality of switching elements for transferring every block charges generated in the photodetecting elements, and drive means for outputting the charges in the form of image signals. In the image sensor, the switching elements in a block of the photodetecting element array and the switching elements in another block located adjacent to the former block are connected by wires in such a way that the switching elements closest to each other between the blocks are interconnected, the switching elements next close to each other are interconnected, and so on. Further, the wires connecting from the switching elements in a block to the switching elements in blocks on both sides of the former block are disposed oppositely with respect to the main scan direction, and are disposed in such a way that the shortest wire connecting the switching elements is located closest to the photodetecting element array, the next short wire is located next close to the photodetecting element array, and so on.

DETAILED DESCRIPTION OF THE PREFERRED EMBODIMENTS

The preferred embodiments of an image sensor according to the present invention will be described with reference to the accompanying drawings.

Figure 1:
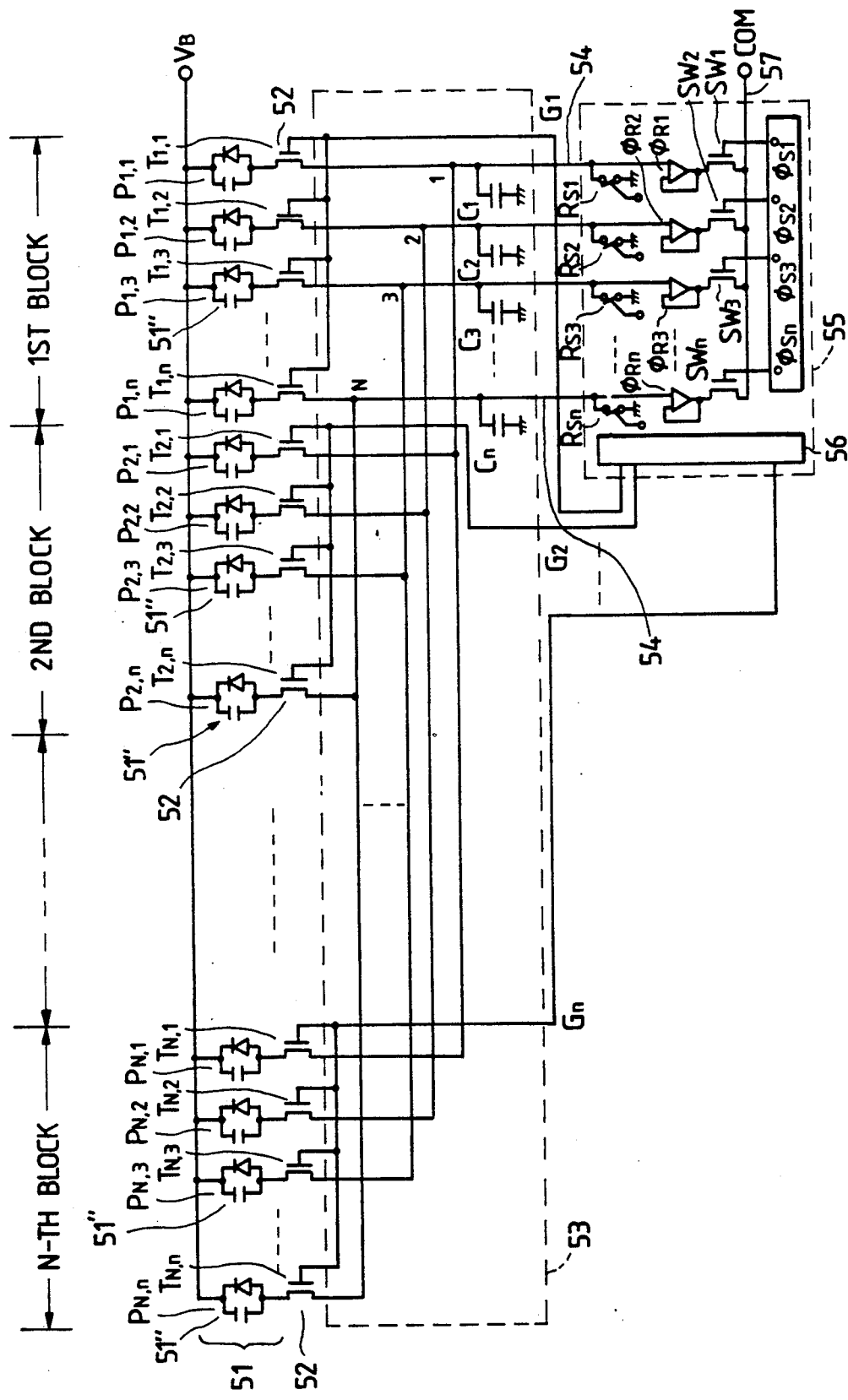
FIG. 1 is an equivalent circuit diagram of a conventional image sensor.
Figure 2:
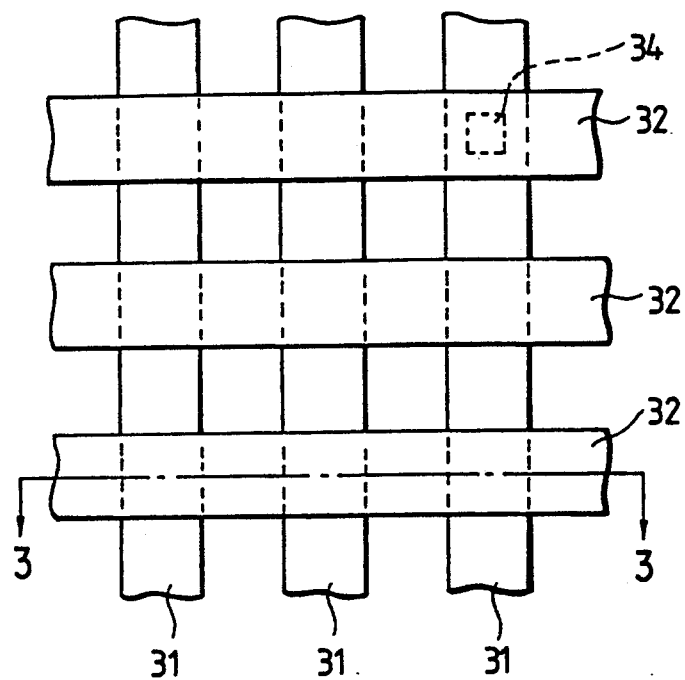
FIG. 2 is a plan view showing the construction of the wiring structure of the image sensor of FIG. 1.
Figure 3:
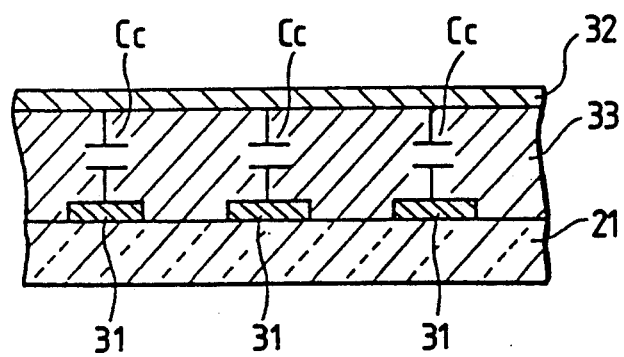
FIG. 3 is a cross sectional view taken on line 3—3 in FIG. 2.
Figure 4:
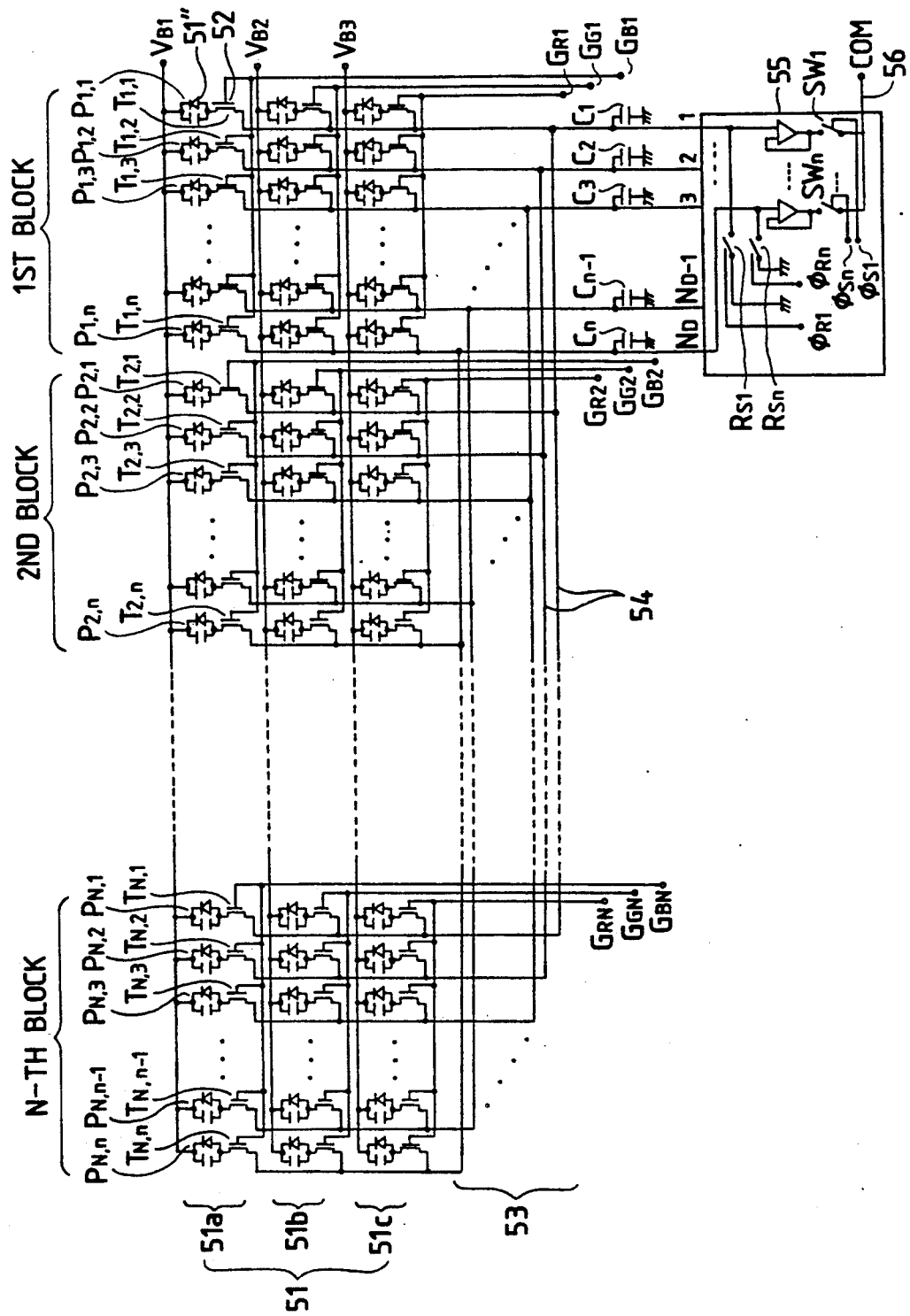
FIG. 4 is an equivalent circuit diagram of a conventional TFT drive color image sensor with a matrix multilayered wiring structure.
Figure 5:
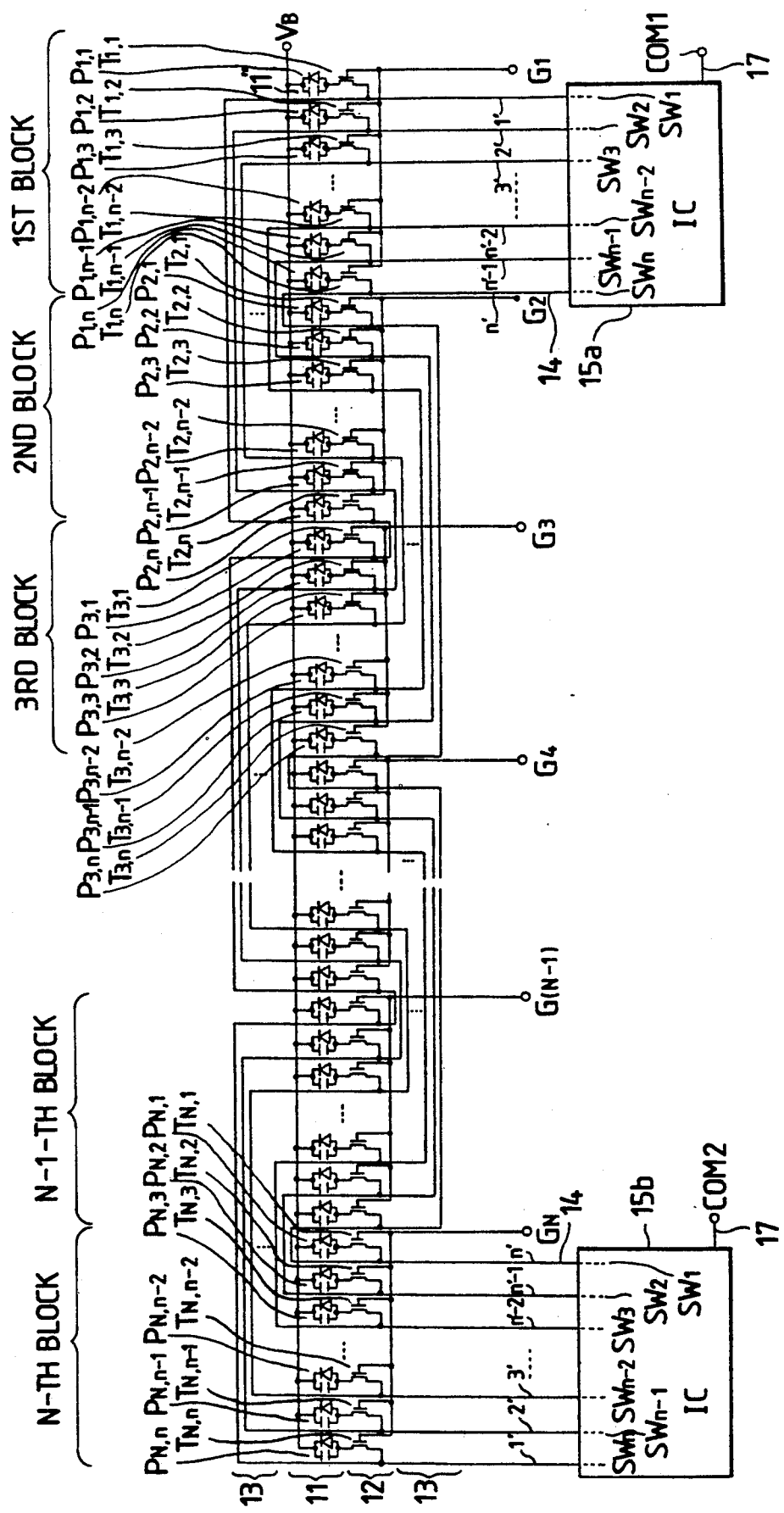
FIG. 5 is an equivalent circuit diagram of a monochromatic image sensor according to an embodiment of the present invention.
Figure 6:
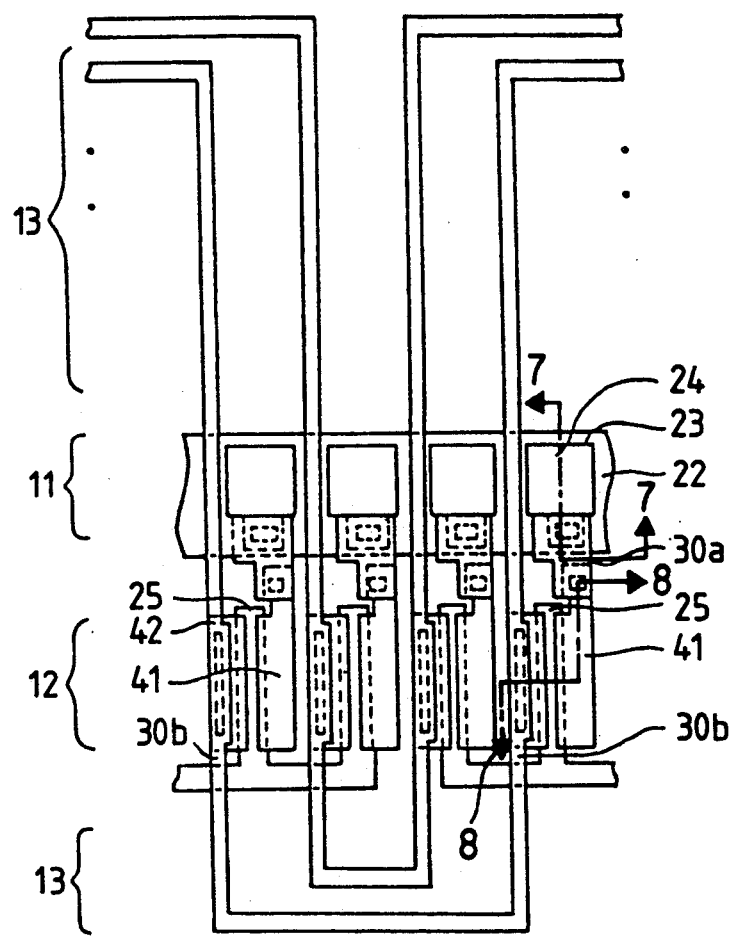
FIG. 6 is a plan view showing a partial structure of the image sensor of FIG. 5 in which photodetecting elements, a charge transfer section, and a wiring structure are included.

FIG. 5 is an equivalent circuit diagram of an image sensor (monochromatic image sensor) according to an embodiment of the present invention. FIG. 6 is a plan view showing a partial structure of the image sensor in which photodetecting elements, a charge transfer section, and a wiring structure are included.

As shown, the image sensor includes a photodetecting element array 11 (containing photo diodes P1,1 to PN,n) consisting of N number of blocks, each block being a group of "n" number of sandwich type photodetecting elements 11" (photo diodes P) arrayed on an insulating substrate made of glass, for example. The image sensor further includes a charge transfer section 12 consisting of thin film transistors T1,1 to TN,n connected to the photodetecting elements 11", wire groups 13 for connecting the adjacent blocks in the charge transfer section 12, "n" number of common signal lines 14, led from the charge transfer section 12 through the wire groups 13, corresponding to the photodetecting element groups in the blocks, and drive ICs 15a and 15b connected to the common signal lines 14. Each of the ICs 15a and 15b includes switches SW1 to SWn for transferring the potentials on "n" number of the common signal lines 14 onto an output line 17 (COM1 or COM2) in a time-sequential manner.

Figure 7:
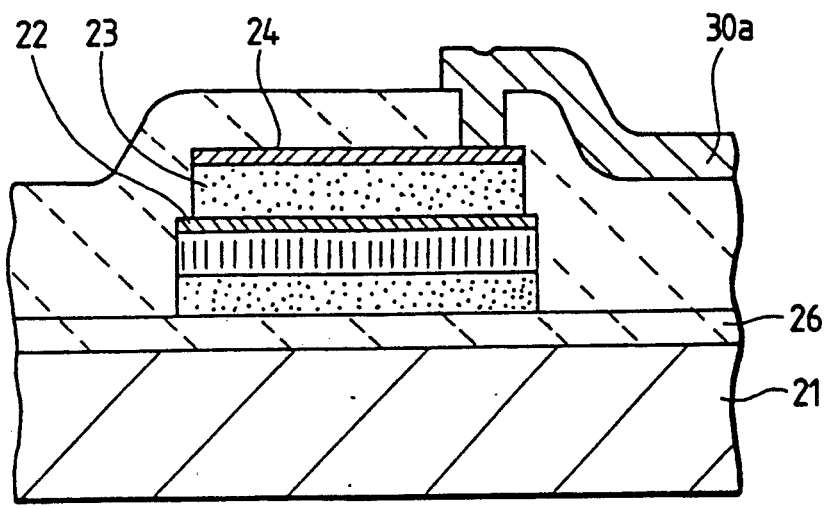
FIG. 7 is a cross sectional view taken on line 7—7 in FIG. 6.

As shown in FIG. 6 and FIG. 7, showing a sectional view taken on line 7—7 has in FIG. 6, each photodetecting element 11" has a sandwich structure including a strip-like metal electrode 22, a photoconductive layer 23, and an upper transparent electrode 24, which are layered in this order on a substrate 21 made of glass, for example. The metal electrode 22 made of chromium (Cr) serves as a lower common electrode. The photoconductive layer 23 is made of amorphous silicon hydride (a-Si: H) and is separately formed for each photodetecting element (bit) 11'. The upper transparent electrode 24 is made of indium tin oxide (ITO) and is separately formed for each photodetecting element.

The lower metal electrode 22, formed like a strip, extends in the main scan direction. The photoconductive layers 23 are discretely formed on the metal electrode 22. The upper transparent electrodes 24 are also discretely formed. The structure in which the photoconductive layer 23 is sandwiched by the metal electrode 22 and the transparent electrode 24, serves as one photodetecting element 11". The combination of the photodetecting elements 11' makes up the photodetecting element array 11. A fixed voltage VB is applied to the metal electrode 22.

One end of each discrete transparent electrode 24 is connected to one end of a wire 30a made of aluminum, for example. The other end of the wire 30a is connected to the drain electrode 41 of a thin film transistor Ti,j of the charge transfer section 21. In the photodetecting element 11", amorphous silicon hydride of the photoconductive layer may be substituted by CdSe (cadmium selenium), for example. If the photoconductive layer 23 of a-Si: H is formed as a single layer, an optoelectric transducing action occurring in a specific photodetecting element 11" interferes with the adjacent photodetecting element 11". The interference must be reduced. It is for this reason that the photoconductive layers 23 and the transparent electrodes 24 are discretely formed.

The photoconductive layers 23 of the photodetecting elements 11" may be a-Si: H. p-i-n, a-SiC or a-SiGe. The photodetecting elements 11", which are photo diodes in the instant embodiment, may be replaced by photoconductors or photo transistors.

Figure 8:
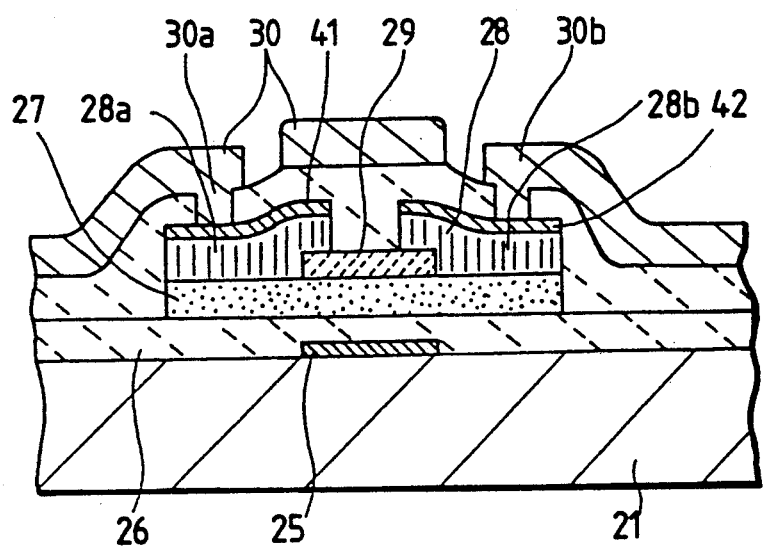
FIG. 8 is a sectional view taken on line 8—8, in FIG. 6.

As shown in FIG. 6 and FIG. 8, showing a sectional view taken on line 8—8, in FIG. 6, the thin film transistors (Ti, j) forming the charge transfer section 12 are transistors with an inverse staggered structure. In each transistor, a chromium (Cr1) layer, a silicon nitride (SiNx) film, an amorphous silicon hydride (a-Si: H) layer, another silicon nitride film, an n+amorphous silicon hydride (n+a-Si: H) layer, a chromium (Cr2) layer, an insulating layer, and an aluminum layer 30 are layered in this order on the substrate 21. The chromium layer (Cr1) serves as a gate electrode 25. The silicon nitride film (SiNx) of an insulating layer 26 serves as an gate insulating film. The amorphous silicon hydride (a-Si: H) layer serves as a semiconductor active layer 27. The silicon nitride (SiNx) film serves as a top insulating film 29 provided opposing the gate electrode 25. The n+amorphous silicon hydride (n+a-Si:H) layer serves as an ohmic contact layer 28. The chromium (Cr2) layer serves as a drain electrode 41 portion and a source electrode 42 portion. The insulating layer is made of polyimide, for example. The aluminum layer 30 serves as a wiring layer.

The ohmic contact layer 28 consists of two separate layers 28a and 28b respectively brought into contact with the drain electrode 41 and the source electrode 42. The chromium (Cr2) layer also consists of two separate layers, the drain electrode 41 and the source electrode 42, which are layered over the ohmic contact layers 28a and 28b. The drain electrode 41 is connected to a wire 30a from the transparent electrode 24 of the photodetecting element 11". The source electrode 42 is connected to a wire 30b of aluminum as a common signal line 14 in the multilayered wiring structure 13.

The semiconductor active layer 27 may be made of polycrystalline silicon, for example. Tantalum (Ta) resistive to electrolytic corrosion may be used for the drain electrode 41 and the source electrode 42, which are made of chromium in the above example.

The construction of the wire groups 13 will be described in detail with reference to FIGS. 5 and 9.

In the wire groups 13, as shown in FIG. 5, the common signal lines 14 (signal lines 1' to n') are led from the drive IC 15a located under the first block. The signal lines 1' to n' are extended and connected to the source electrodes 42 of the thin film transistors T1,1 to T1,n of the first block. As shown in FIG. 6, the signal lines 1' to n' each pass on the insulating layer of polyimide between the adjacent photodetecting elements 11" and 11", in the form of a metal wire of aluminum (Al), for example. On the upper side of the photodetecting element array 11, the signal lines 1' to n' extends toward the second block, and each again pass on the insulating layer of polyimide between the adjacent photodetecting elements 11" and 11", in the form of a metal wire of Al. Those signal lines are connected to the source electrodes 42 of the thin film transistors T2,n to T2,1 of the second block.

More specifically, the signal line 1' is connected to the source electrode 42 of the thin film transistor T1,1 of the first block, and the source electrode 42 of the thin film transistor T2,n of the second block. The signal line 2' is connected to the source electrode 42 of the thin film transistor T1,2 of the first block, and the source electrode 42 of the thin film transistor T2,n−1 of the second block. In this way, in the adjacent blocks, the source electrodes 42 of the thin film transistors T are connected to each other by the signal lines in the order from the extreme sides of the blocks to the inner elements of the blocks. The signal line n' is connected to the source electrode 42 of the thin film transistor T1,n of the first block, and the source electrode 42 of the thin film transistor T2,1 of the second block. In other words, the connected thin film transistors between the adjacent blocks are closest to each other.

Figure 9:
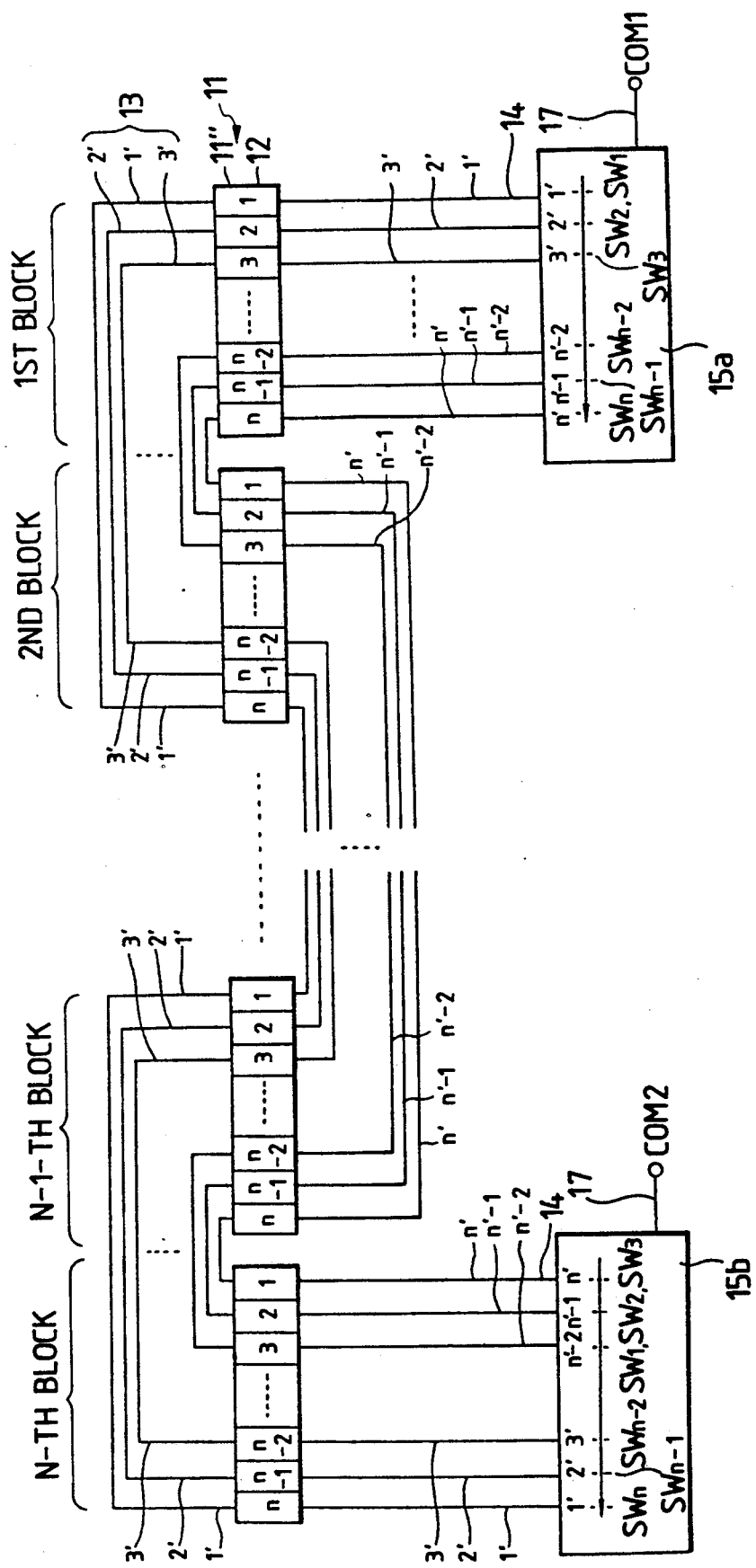
FIG. 9 is a block and wiring diagram showing a layout of the wire group of the image sensor.

In this case, as shown in FIG. 9, showing a layout of the wire groups, on the upper side of the photodetecting element array 11, the wires connecting the photodetecting elements 11" are laid out close to and along the photodetecting element array 11 (in the main scan direction). In the layout of the wire groups, the shortest signal line is closest to the array, the secondly short signal line is located outside the shortest signal line, and the longest signal line is most apart from the array. The layout of the wire groups will be described in detail by using the wire group between the first and second blocks. The shortest signal line n' is disposed closest to the photodetecting element array 11. The signal line n'−1 is disposed further away from to the array 11. In the wire group 13, the longest signal line 1' is disposed furthest apart from the array. Since the wires of the wire group are thus arranged, the signal lines will not intersect between th first and second blocks and hence the cross talk will not occur.

A specific arrangement of the wire group 13 between the second and third blocks will be described in detail with respect to FIG. 5. The source electrodes 42 of the thin film transistors T2,1 to T2,n in the second block are respectively connected to the source electrodes 42 of the thin film transistors T3,n to T3,1 in the third block by means of the signal lines n' to 1' disposed on the lower side of the photodetecting element array 11. More specifically, the signal line n' is connected to the source electrode 42 of the thin film transistor T2,1 in the second block, and the source electrode 42 of the thin film transistor T3,n in the third block. The signal line n'−1 is connected to the source electrode 42 of the thin film transistor T2,2 in the second block, and the source electrode 42 of the thin film transistor T3,n−1 in the third block. In this way, between the adjacent blocks, the source electrodes 42 of the thin film transistors T are connected to each other by the signal lines so that the transistors most apart from each other are connected, and those closer together are connected. Further, the source electrode 42 of the thin film transistor T2,n in the second block is connected to the source electrode 42 of the thin film transistor T3,1 in the third block by the signal line 1'. In other words, between the adjacent blocks, the source electrodes 42 of the thin film transistors T are successively connected to each other by the signal lines so that the thin film transistors closest to each other are connected, the transistors further away are connected, and so on.

In this case, as shown in FIG. 9, on the lower side of the photodetecting element array 11, the wires connecting the transistors are laid out close to and along the arrays 11 (in the main scan direction) in such a way that the wire connecting the closest transistors is located closest to the array 11, the wire connecting the more further apart transistors are located outside the inner wire, and the wire connecting the transistors most apart from each other is in the outermost location. The layout of the wires will be described in detail by using the wires between the second and third blocks. The shortest signal line 1' is located closest to the photodetecting element array 11. The signal line 2' is disposed outside signal line 1'. The longest signal line n' in the wire group 13 is located in the outermost location. Since the wires are thus arranged, the signal lines will not intersect between the second and third blocks, removing the crosstalk problem.

An overall layout of the wires will be described with reference to FIG. 9. In FIG. 9, the layouts of the wire groups 13 connecting the photodetecting elements in the odd-numbered block to those in the even-numbered block are located on the upper side of the photodetecting element array 11. The layouts of the wire groups 13 connecting the transistors in the even-numbered block to those in the odd-numbered block are located on the lower side of the photodetecting element array 11. Therefore, the wires led from the odd-numbered block to the even-numbered block will not intersect those led from the even-numbered block to the odd-numbered block, eliminating the crosstalk problem.

In the instant embodiment, if the N-th block is an even-numbered block, as the drive IC 15a is provided on the lower side of the first block, a drive IC 15b is provided on the lower side of the N-th block as the even-numbered block. The analog switches SW1 to SWn in the drive IC 15a are respectively connected to the signal lines 1' to n'. The signal lines to which the source electrodes 42 of the thin film transistors TN,1 to TN,n in the N-th block are connected, are connected to the drive IC 15b. The analog switches SW1 to SWn in the drive IC 15b are the signal lines n' to 1' led from the drive IC 15a in this order.

An "n" number of common signal lines 14 to be connected to the analog switches SW1 to SWn in the drive ICs 15a and 15b are led from the wire groups 13. Charges stored in the signal lines of the wire groups 13 cause potentials to vary in the common signal lines 14. The varied potential values are picked up onto the output lines 17 (COM1, 2) by the operation of the analog switches. In the drive ICs 15a and 15b, the analog switches SW1 to SWn are operated in this order to read the potential values on the signal lines.

Figure 10:
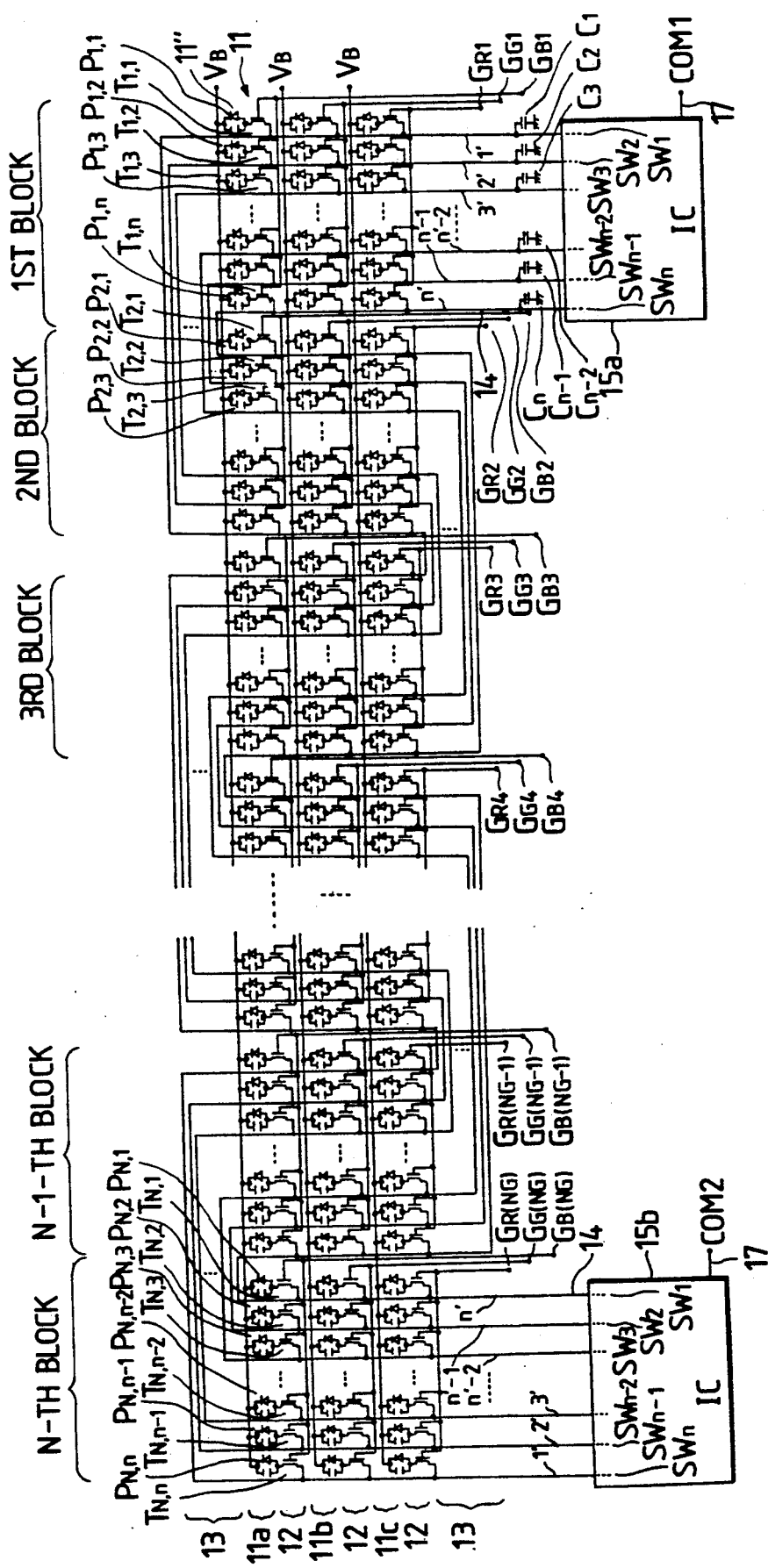
FIG. 10 is an equivalent circuit diagram of a color image sensor according to another embodiment of the present invention.

An equivalent circuit of a color image sensor according to another embodiment of the invention will be described with reference to FIG. 10. In FIG. 10, the same reference symbols as in FIG. 5 are used for designating like or equivalent portions.

As shown in FIG. 10, in the color image sensor, "n" number of sandwich type photodetecting elements (photo diodes P) 11" arrayed on an insulating substrate made of glass, for example, are grouped into a block. N number of blocks make up a photodetecting element array 11 (consisting of photo diodes P1,1 to PN,n). Three lines of photodetecting element arrays 11a, 11b, and 11c are arranged in the subsidiary scan direction. The array 11a is coupled with a red (R) passing filter. The array 11b is coupled with a green (G) passing filter. The array 11c is coupled with a blue (B) passing filter. The color image sensor further includes charge transfer sections 12 each consisting of thin film transistors T1,1 to TN,n connected to the photodetecting elements 11", wire groups 13 interconnecting the charge transfer sections 12 between the adjacent blocks, "n" number of common signal lines 14, led from the charge transfer sections 12 through the wire group 13, corresponding to the grouped photodetecting elements of each block, and drive ICs 15a and 15b connected to the common signal lines 14. Each of the ICs 15a and 15b includes analog switches SW1 to SWn for time-sequentially picking up the potentials on the "n" number of common signal lines 14 onto an output line 17 (COM1 or COM2).

One end of the photodetecting elements 11" receives voltages VB1, VB2, and VB3 through common electrodes provided for respective element arrays. The wires, which are led from the thin film transistors (TFTs) of the charge transfer section 12, which are connected to the photodetecting elements 11" in the array 11a of the first line, are connected to the source electrodes of the thin film transistors connected to the photodetecting elements 11" in the arrays 11b and 11c of the second and third lines. Those wires are connected as common wires to the wire groups 13, that is, to the common signal lines 14 whose number is equal to that of the photodetecting elements 11" in the block of the photodetecting element array 11. The gate electrodes of the thin film transistors of the photodetecting element arrays 11 are connected every block, and accordingly gate terminals GR1 to GRN, GG1 to GGN, and GB1 to GBN are provided corresponding to the three lines of the photodetecting element arrays 11a, 11b, and 11c.

Figure 11:
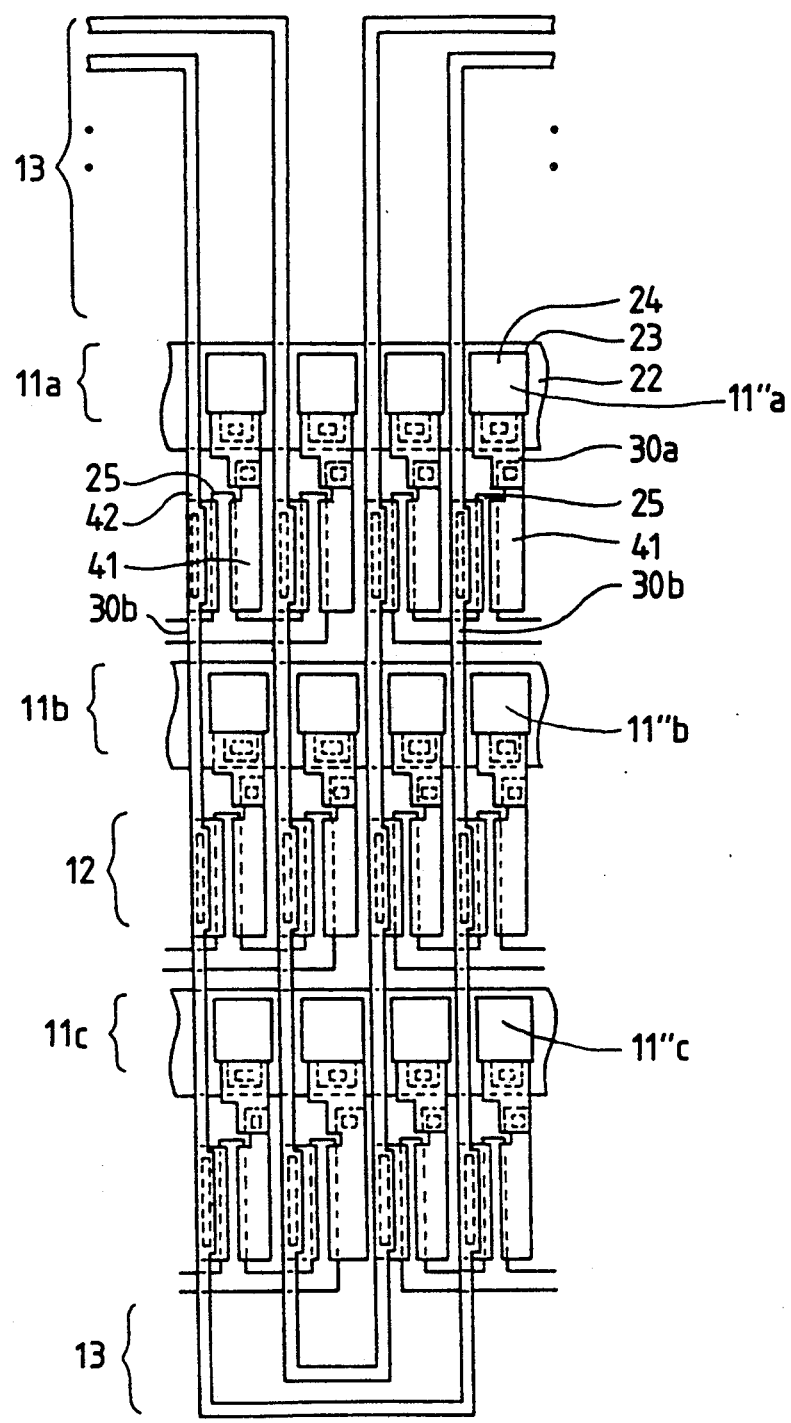
FIG. 11 is a plan view partially showing the photodetecting elements 11", the thin film transistors, and the wire group 13 of the color image sensor.

FIG. 11 is a plan view partially showing the photodetecting elements 11", the thin film transistors, and the wire groups 13 of the color image sensor.

The construction of the photodetecting elements 11" of the color image sensor is the same as that of the monochromatic image sensor except that the three lines of photodetecting element arrays 11a, 11b, and 11c are arranged in the subsidiary scan direction. Further, a color filter (not shown) for separating color information is disposed on each transparent electrode 24. That is, color filters for reading different colors are provided for the respective photodetecting element arrays 11. A filter for reading red (R) is disposed on the photodetecting elements 11"a; a filter for reading green (G), is disposed on the photodetecting elements 11"b; and a filter for reading blue (B), is disposed on the photodetecting elements 11"c.

The construction of each thin film transistor (Ti,j) forming the charge transfer section 12 is the same as that of the thin film transistor in the monochromatic image sensor. The interconnection of the thin film transistors of the charge transfer section 12 to be connected to the photodetecting elements 11" of the photodetecting element array 11a of the first line, those transistors in the second line array 11b, and those transistors in the third line array 11c will be described with reference to FIG. 11. The source electrodes of the thin film transistors of the charge transfer sections 12 in the first to third line arrays 11a to 11c are connected for each block by aluminum wires 30b to serve as common signal lines 14, while both being aligned with each other in the subsidiary scan direction. In other words, the common signal lines 14 are wired with the specific points along the lines being connected to the source electrodes 42 of the thin film transistors.

The construction of the wire groups 13 in the color image sensor is similar to that of the wire groups 13 in the monochromatic image sensor. In the color image sensor, the common signal lines 14 connect the source electrodes 42 of the thin film transistors of the photodetecting element arrays 11a, 11b, and 11c for each block.

A method of manufacturing an image sensor of an embodiment according to the present invention will be described with reference to FIGS. 7 and 8.

A first chromium (Cr1) layer to serve as gate electrode 25 is formed, of approximately 750Å thickness, on a substrate 21 of glass, for example, which has been inspected and washed, by the DC sputtering method. The Cr1 layer is patterned by photolithographic process and etching process. The structure is subjected to the BHF process, and the alkali cleaning. Following this step, in order to form on the Cr1 pattern an insulating layer 26 for the thin film transistor (TFT) portion, semiconductor active layer 27 deposited on the insulating layer, and additional insulating layer 29 deposited on the semiconductor active layer, a silicon nitride (SiNx) film of approximately 3000Å thickness, an amorphous silicon hydride (a-Si: H) film of approximately 500Å thickness, and a silicon nitride film (SiNx) of approximately 1500Å thickness are deposited in this order by the plasma CVD (P-CVD) method, while maintaining a vacuum state. The lower insulating layer 26 in the TFT is referred to as a bottom-SiNx (b-SiNx) film, and the upper insulating layer 29 is referred to as a top-SiNx (t-SiNx) film. In this case, as those layers are continuously formed while keeping the vacuum state, the interfaces between them can be kept clean and hence a better S/N ratio of the resultant product can be gained.

The conditions for forming the b-SiNx film by the P-CVD method are: substrate temperature of 300° to 400° C., gaseous pressure of $SiH_4$ and $NH_3$ of 0.1 to 0.5 Torr, $SiH_4$ flow rate of 10 to 50 sccm, $NH_3$ flow rate of 100 to 300 sccm, and RF power of 50 to 200 W.

The conditions for forming the a-Si: H film by the P-CVD method are: substrate temperature of 200° to 300° C., $SiH_4$ gaseous pressure of 0.1 to 0.5 Torr, $SiH_4$ flow rate of 100 to 300 sccm, and RF power of 50 to 200 W.

The conditions for forming the t-SiNx film by the P-CVD method are: substrate temperature of 200° to 300° C., gaseous pressure of $SiH_4$ and $NH_3$ of 0.1 to 0.5 Torr, $SiH_4$ flow rate of 10 to 50 sccm, $NH_3$ flow rate of 100 to 300 sccm, and RF power of 50 to 200 W.

To conform the top insulating layer 29 to a pattern of the gate electrode 25, the top insulating layer 29 is patterned in the following manner. The upper surface of the top insulating layer 29 is coated with resist. With a mask of the pattern of the gate electrode 25, the rear side of the substrate 21 is exposed to light to develop for removal of the resist film.

Subsequently, the structure is subjected to the BHF process, and an $n^+$a-Si: H layer as an ohmic contact layer 28 is deposited thereon, with approximately 1000Å in thickness, by the P-CVD method. A second chromium (Cr2) layer, which is to be used as the drain electrode 41 and the source electrode 42 of the TFT, and the lower metal electrode 22 of the photodetecting element 11″, is deposited, with 1500Å thickness, by the DC magnetron sputtering method. An a-Si: H to be used as the photoconductive layer 23 of the photodetecting element 11″ is deposited, with approximately 13000Å thickness, by the P-CVD method. Then, an ITO film to be used as the transparent electrode 24 of the photodetecting element 11″ is deposited, with approximately 600Å thickness, by the DC magnetron sputtering method. Before forming those films, alkaline cleaning is required.

Afterwards, to form the discrete transparent electrodes 24 of the photodetecting elements 11″, the ITO film is patterned by the photolithographic process and the etching process. Using the same resist pattern, the a-Si: H layer for the photoconductive layer 23 is patterned by dry-etching process. The chromium (Cr2) layer for the metal electrode 22 serves as a stopper during the dry etching process and is not patterned. Since the a-Si: H layer as the photoconductive layer 23 is side-etched greatly during the dry-etching process, the ITO film is again subjected to the etching process before the resist film removal. The ITO film is further etched from its periphery of the rear side, so that the ITO film formed has a size equal to that of the a-Si: H layer.

The conditions for forming the a-Si: H film by the P-CVD method are: substrate temperature of 170° to 250° C., $SiH_4$ gaseous pressure of 0.3 to 0.7 Torr, $SiH_4$ flow rate of 150 to 300 sccm, and RF power of 100 to 200 W.

The conditions for forming the ITO film by the DC sputtering method are: substrate temperature being at room temperature, gaseous pressure of Ar and $O_2$ of $1.5 \times 10^{-3}$ Torr, Ar gas flow rate of 100 to 150 sccm, $O_2$ gas flow rate of 1 to 2 sccm, and DC power of 200 to 400 W.

The chromium layer Cr2, which is to be used as the chromium layer of the metal electrode 22 of the photodetecting element 11″ and the chromium layer of the drain electrode 41 and the source electrode 42 of the TFT, is patterned by the photolithographic process and the etching process. The $n^+$a-Si: H layer serving as the lower layer for the chromium layer of the metal electrode 22 of the photodetecting element 11, and the $n^+$a-Si: H layer for the ohmic contact layer 28 of the TFT are both etched by using the same resist pattern.

Next, to form a pattern of the gate insulating layer 26 of the TFT, the b-SiNx layer is patterned by a photolithographic etching process. An insulating layer of polyimide of approximately 11500Å thickness is applied so as to cover the image sensor, and the structure is pre-baked and subjected to photolithographic etching process to form contact portions, and is baked again. The structure is further coated with a second insulting layer of polyimide of approximately 500Å thickness, and the resultant structure is subsequently subjected to the baking, photolithographic etching, and baking processes. As a result, in the photodetecting element 11″, the following portions are formed; the contact portion to supply electric power to the metal electrode 22 and the portions to pull charges out of the transparent electrode 24. In the TFT, the contact portion connected to the wire 30a for transferring charges generated in the photodetecting element 11″, and the contact portion to lead charges to the wire groups 13 are formed. Thereafter, to completely remove the polyimide left on the contact portions, the structure is subjected to a Descum process in which it is placed in a plasma atmosphere of O$_2$.

Subsequently, an aluminum (Al) layer of 15000Å thickness is deposited so as to entirely cover the image sensor by the DC magnetron sputtering method. The aluminum layer is subjected to the photolithographic etching process to form a desired pattern. As a result, in the photodetecting element 11'', formed is a wire pattern including the wire portion to supply electric power to the metal electrode 22, the wire portion 30a to pull charges out of the transparent electrode 24 and to connect to the drain electrode 41 of the TFT, and the wire groups 13 connecting to the source electrode 42 of the TFTs.

Finally, the structure is coated with polyimide to serve as a passivation layer (not shown). The polyimide-coated structure is pre-baked, subjected to photolithographic etching process for patterning, and is further baked to form the passivation layer. The resultant structure is subjected to the Descum process to remove the polyimide still left.

In the case of the color image sensor, color filters are formed on the photodetecting element arrays 11. In this instance, a filter allowing red to pass therethrough is provided on the first photodetecting element array 11a; a filter allowing green to pass therethrough, on the second array 11b, and a filter allowing blue to pass therethrough, on the third array 11c. Thereafter, the drive ICs 15a, 15b and the like are mounted, and wire bonding and assembling work are performed to complete the image sensor.

The wire groups 13 entirely made of aluminum (Al) are patterned so that they meander through the photodetecting element array 11 or the lines of the photodetecting element arrays in a zig-zag fashion, while being connected at specific points to the source electrodes 42 of the TFTs. Accordingly, the resistance of the wire groups 13 may be reduced.

The wire groups 13 may have another construction. In the construction, only the wire portions of the wire groups 13 each lying between the adjacent photodetecting elements 11'' and 11'' are formed in the same step to form the chromium (Cr1) pattern of the gate electrodes 25. The remaining wire portions of the wire groups, made of aluminum, are formed through contact holes formed in the insulating layers 26. The wire pattern, except the wire portions lying between the adjacent photodetecting elements 11'', is made of aluminum even if the wire pattern belongs to the horizontal wire portion and the vertical wire portion of the wire group 13. With the construction of the wire groups, even in such a case where the space between the adjacent photodetecting elements 11'' and 11'' is not satisfactorily wide, if the Cr1 layer is used for the wires, each wire may be formed between the adjacent photodetecting elements 11'' and 11''. Additionally, since a fixed bias voltage is applied to the metal electrodes 22 of the photodetecting elements 11'', the metal electrodes 22 may protect the Cr1 wires from any adverse influence (crosstalk) by the voltage variation in the adjacent photodetecting elements.

In still another construction of the wire groups, the whole of the wire groups 13 are formed in the same step to form the chromium (Cr1) layer for the gate electrodes 25, by using the chromium layer.

A method of driving the image sensor thus constructed will be described below.

When an original document (not shown) placed on the photodetecting element array 11 is illuminated with light emitted from a light source (not shown), the light reflected on the original illuminates the photo detecting elements (photo diodes P) to cause the photodetecting elements to generate charges according to the light and shade on the original. The generated charges are stored in the parasitic capacitors of the photodetecting elements 11''. In response to a gate pulse $\phi$G applied from a gate pulse generator (not shown) through the gate signal line Gi, the thin film transistors T are turned on to connect the photo diodes and the common signal lines, so that the charges stored in the parasitic capacitors of the photodetecting elements 11'' and the like are transferred to the wire capacitors of the wire group 13. A case where charges are generated in the photo diodes P1,1 to P1,n in the first block will be described. In response to a gate pulse $\phi$G1 from the gate pulse generator, the thin film transistors T1,1 to T1,n are turned on, so that the charges generated by the photo diodes P1,1 to P1,n are uniformly and entirely distributed over the wire groups 13. The charge of the photo diode P1,1 is transferred to and stored in the wire capacitor of the entire signal line 1'; the charge of the photo diode P1,2, to the entire signal line 2'; and the charge of the photo diode P1,n, to the entire signal line n'.

Figures 12, 13:
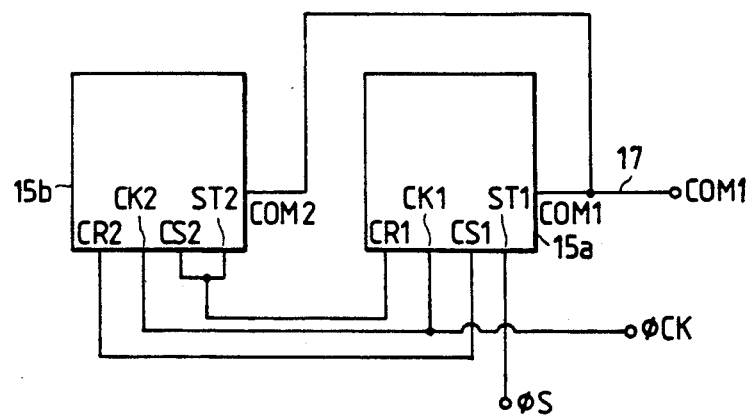
FIG. 12 is a block and wiring diagram showing the connection of drive ICs of the image sensor.
FIG. 13 is a table useful in explaining the output signals of the drive ICs shown in FIG. 12.

Since the instant embodiment uses two drive ICs 15a and 15b, as shown in FIGS. 5 and 9, correlative operations of the drive ICs 15a and 15b will be described. The drive ICs are interrelated as shown in FIG. 12. The drive IC 15a is designed to receive a start signal $\phi$s to start the operation of externally reading the potentials of the wire capacitors. When reading in the start signal $\phi$s at a signal read-in terminal ST1, the drive IC 15a fetches the potentials of the wire capacitors of the first block, and successively turns on the switches SW1 to SWn therein, to read out the charges stored in the wire capacitors of the signal lines 1' to n' and to output them from the output line COM1.

When the operation of reading the charges in the first block is completed, a signal is transferred from a signal generating terminal CR1 of the IC 15a to signal read-in terminals ST2 and CS2 of the drive IC 15b. When the drive IC 15b receives the signal, the switches SW1 to SWn in the drive IC 15b are successively turned on, so that the charges stored in the wire capacitors of the signal lines 1' to n' are read therefrom and outputted from the output line COM2. The terminals ST2 and CS2 are connected to an OR circuit in the IC. Accordingly, when a signal is inputted to either of the terminals, the drive IC 15b is set in an operable state, and operates to read the charges of one block (in this instance, the second block).

When the operation of reading the charges in the second block is completed, a signal is transferred from a signal generating terminal CR2 of the IC 15b to the signal read-in terminal CS1 in the drive IC 15a. When receiving the signal, the drive IC 15a outputs the charges on the third block from the output line COM1. Also when the terminal CS1 receives the signal, the IC 15a operates to read the charges of one block (here, the third block), as the related IC 15b does so when the terminal CS2 receives the signal.

In this way, the charges in the first to N-th blocks in the photodetecting element array 11 are read out to the COM, alternately through the output line COM1 of the drive IC 15a or the output line COM2 of the drive IC 15b. When a signal is generated from the terminal CR1, the output from the output line COM1 is continuously in an off state until a signal reaches the terminal CS1. When a signal is generated from the terminal CR2, the output from the output line COM2 is continuously in an off state until a signal reaches the terminal CS2.

A clock pulse φCK is applied from exterior to the drive ICs 15a and 15b at fixed time intervals. The drive ICs read the charges in the first to N-th blocks through the output operation alternately through the output line COM1 and the output line COM2, to terminate their operation to complete the reading of one line of the original.

Thus, the charges of the odd-numbered blocks are read out by the drive IC 15a, and the charges of the even-numbered blocks are read out by the drive IC 15b. The reason for this is that the order of the successive reading of the charges (read direction) in the odd-numbered blocks is reverse to that in the even-numbered blocks. To be more specific, the drive IC 15a reads the charges stored in the signal lines 1' to n' in the order from the signal line 1' to the signal line n' by means of the analog switches SW1 to SWn, and outputs them through the output line COM1. Accordingly, to read the charges of the first to N-th blocks, the charges are read out of the signal lines in the order of the signal line 1' to the line n', because in the odd-numbered blocks, the first to n-th charges of the photo diodes P are respectively stored in the signal lines 1' to n'. In the even-numbered blocks, the first to n-th charges of the photo diodes P are respectively stored in the signal lines n' to 1'. Accordingly, the charges are read out of the signal lines in the order from the signal line n' to the line 1'. Thus, the read direction in the odd-numbered blocks is reverse to that in the even-numbered blocks. It is for this reason that the drive IC 15a selectively reads only the charges in the odd-numbered blocks.

On the other hand, in the drive IC 15b the charges in the even-numbered blocks are read. In the even-numbered blocks, the first to n-th numbered charges of the photo diodes P are stored in the signal lines n' to 1'. The drive IC 15b reads the charges from the signal lines in the order from the signal lines n' to 1', and outputs the charges from the output line COM2. Accordingly, the charges generated by the 1st to n-th photo diodes P in the even-numbered blocks are outputted as image signals onto the output line COM2. On the other hand, in the even-numbered blocks, the charges generated in the n-th to first photo diodes P are outputted as image signals onto the output line. As a result, the drive IC 15b selectively reads only the charges in the even-numbered blocks.

As described above, the drive ICs 15a and 15b selectively output the charges of the odd-numbered blocks and the even-numbered blocks through the output lines COM1 and COM2, and alternately combines the output charge signals and output such a combined signal from the output line COM. Consequently, the image signals of the first to N-th blocks may be successively outputted, as shown in the table of FIG. 13.

In the instant embodiment, a plurality of photodetecting elements 11" are grouped into a block. The wires lying between the source electrodes 42 of the thin film transistors connecting to the photodetecting elements 11" in one block and the source electrodes 42 of the thin film transistors connecting to the photodetecting elements 11" in the block adjacent thereto, are arranged in the order of the distances each between the source electrodes 42 of the thin films in the adjacent blocks from the shortest to the longest. Further, the wires lying between the source electrodes 42 of the thin film transistors connecting to the photodetecting elements 11" in the block and the source electrodes 42 of the thin film transistors connecting to the photodetecting elements 11" in the block adjacent thereto, are alternately arranged in the main scan direction of the photodetecting element array 11. The wires connecting the source electrodes are laid out such that the shortest wire is disposed closest to the array 11, and the longest wire is disposed furthest apart from the array. Therefore, the signal lines will not intersect each other. The charges stored in the wire capacitors of the wire groups 13 can be accurately read therefrom, while being free from any crosstalk problem. Therefore, the image sensor of the instant embodiment has an improved reproduction of gradation.

In the instant embodiment, two drive ICs, the drive ICs 15a and 15b, are provided. The drive IC 15a is used for reading charges generated in the odd-numbered blocks, and the drive IC 15b, for reading the charges generated in the even-numbered blocks. The output charge signals of both the drive ICs are combined into image signals. Therefore, the output processing may be performed more easily than when the image signal is outputted from a single drive IC.

A method of driving the color image sensor is substantially the same as that of driving the monochromatic image sensor. The charges are read out of the photodetecting elements 11" every block (consisting of a plurality of photodetecting elements). The charge read operation is applied for the first photodetecting array 11a (responsive to red), the second photodetecting array 11b (responsive to green), and the third photodetecting array 11c (responsive to blue). The image signals (image data) read out of the first to third photodetecting arrays 11a to 11c are stored into a memory (not shown) outside the sensor. The pitches between the photodetecting element arrays are calculated, and the image data is composed on the basis of the calculation.

In the color image sensor of the instant embodiment, three lines of photodetecting element arrays are arranged one upon another in the subsidiary scan direction. In those arrays, a plurality of photodetecting elements 11" are grouped into one block. The source electrodes 42 of the thin film transistors connected to the photodetecting elements 11" in each line of the array are connected for each block by wires as common wires such that when connected, the source electrodes are aligned in the subsidiary scan direction. The wires lying between the common wires, which connect the source electrodes 42 of the thin film transistors in the blocks, are aligned in the subsidiary scan direction, and the common wires, which connect the source electrodes 42 of the thin film transistors in the blocks adjacent thereto, are arranged in the order of the distances each between the source electrodes 42 of the thin, film transistors in the adjacent blocks from the shortest to longest. In the lines of the photodetecting element arrays, the wires are alternately positioned in the main scan direction. The connected wires are arranged such that the shortest wire is disposed closest to the photodetecting element array, the secondly short wire is disposed outside the shortest wire, and the longest wire is disposed most apart from the array. Therefore, the signal lines will not intersect each other. No interference occurs among the wire groups 13. The charges stored in the wire capacitors of the wire group can be accurately read therefrom. The image sensor of the instant embodiment has a good reproduction of gradation without crosstalk.

Figure 14A:
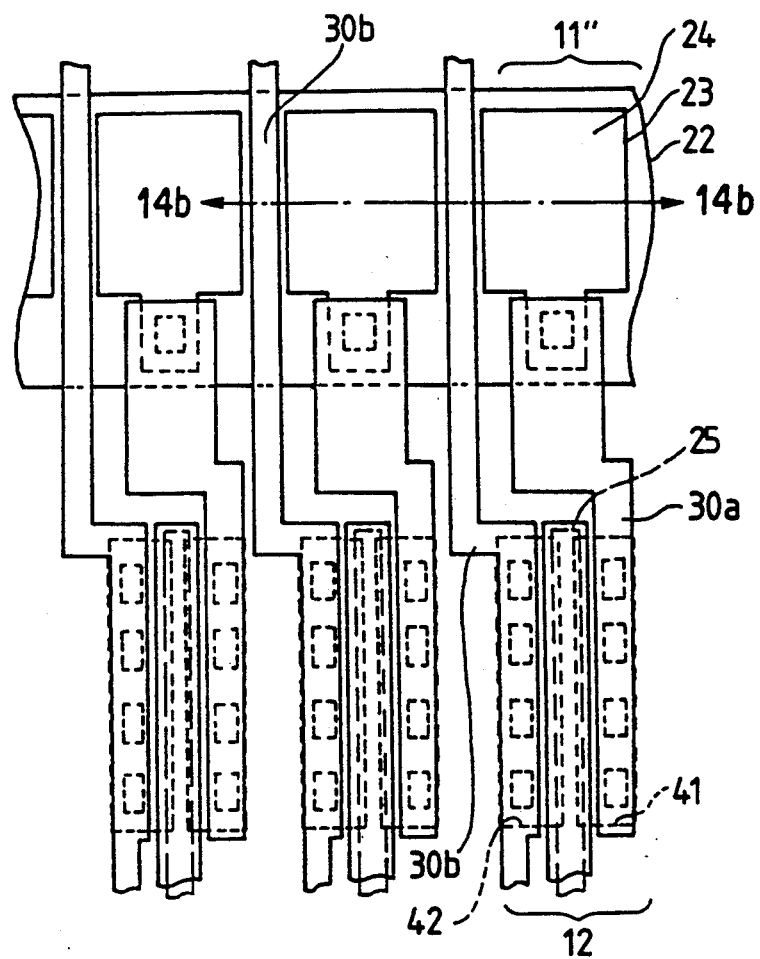
FIG. 14(a) is a plan view showing another construction of the image sensor expressed by the equivalent circuit shown in FIG. 5.
Figure 14B:
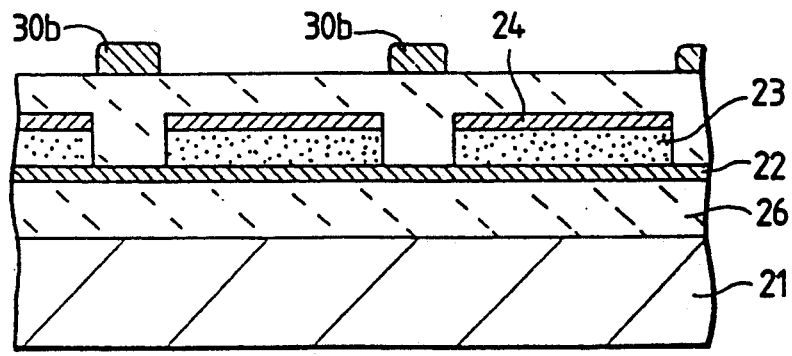
FIG. 14(b) is a cross sectional view taken on line 14(b)—14(b) in FIG. 14(a)

FIG. 14(a) is a plan view showing another construction of the image sensor expressed by the equivalent circuit shown in FIG. 5. FIG. 14(b) is a cross sectional view taken on line 14(b)—14(b) in FIG. 14(a). In FIGS. 14(a) and 14(b), the same reference symbols are used for designating like or equivalent portions in FIG. 6.

In this embodiment, wires 30b are provided on an insulating layer of polyimide covering the photodetecting elements 11″, and passes between the adjacent photodetecting elements 11″ and 11″. The signal lines 1, to n, extend toward the second block on the upper side of the photodetecting element array, and again pass between the photodetecting elements 11″ on the polyimide layer. The signal lines are connected at specific points to the source electrodes 42 of the thin film transistors T2,n to T2,1 of the second block.

A method of manufacturing the image sensor thus constructed will be described. A chromium (Cr1) layer is formed on a substrate 21 made of glass, for example, by the DC sputtering method. A pattern of gate electrodes 25 of the thin film transistors (TFTs) in the charge transfer section 12 is formed by photolithographic and etching processes. An insulating layer 26 serving as gate insulating layers of the TFTs is formed thereon, a semiconductor active layer 27 as an a-Si: H layer is then formed thereon, and a top insulating layer is formed thereon. The top insulating layer 29 is patterned corresponding to the gate electrodes 25. An n+a-Si:H layer of the ohmic contact layer 28 is formed thereon. Additionally, a chromium layer (Cr2) to be used for the drain electrodes 41 and the source electrodes 42 of the TFTs, and the metal electrodes 22 of the photodetecting element portion is formed.

A photoconductive layer 23 and a transparent electrode 24 of the photodetecting element portion are formed. The transparent electrode 24 and the photoconductive layer 23 are separated into discrete electrodes and discrete layers by photolithographic etching process. The Cr2 layer for the metal electrodes 22, the drain electrodes 41 and the source electrodes 42 are patterned by photolithographic etching process. Thereafter, the TFT portion is etched in a mixed gas of HF$_4$ and O$_2$. In the etching process, the CR2 layer and the portion not covered with the insulating layer are etched away to form a pattern of the semiconductor active layers 27 of a-Si: H and the ohmic contact layers 28 of n+a-Si: H.

An insulating layer of polyimide is formed on the structure, contact holes are formed at required locations, and the wire groups 13 of aluminum are formed.

The reason why aluminum wire groups 13 are formed on the polyimide insulating layer follows. Since the wire groups constitute the uppermost layer of the metal layers of the structure, the wire groups may be formed thick, leading to reduced sheet resistance. Particularly for long wires, this feature is effective for reducing the sheet resistance.

Figure 15A:
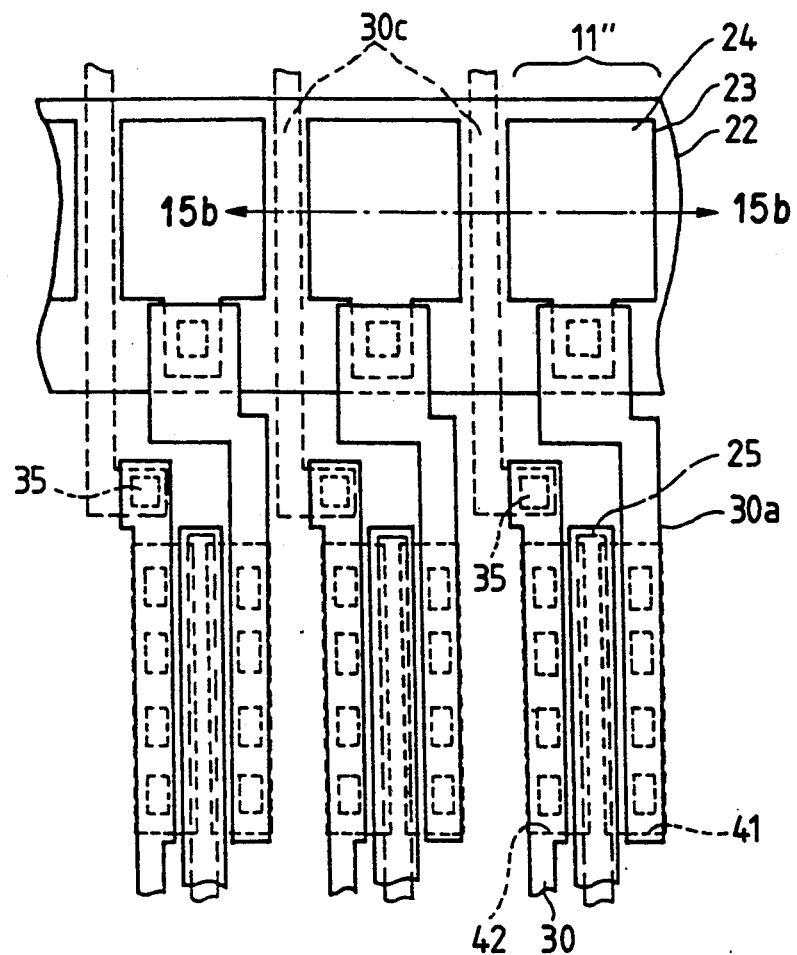
FIG. 15(a) is a plan view showing yet another construction of the image sensor.
Figure 15B:
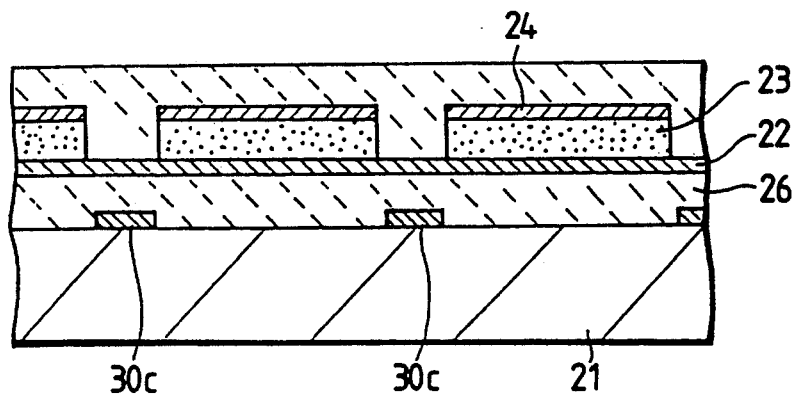
FIG. 15(b) is a cross sectional view taken on line 15(b)—15(b) in FIG. 15(a)

FIG. 15(a) is a plan view showing yet another construction of the image sensor, and FIG. 15(b) is a cross sectional view taken on line 15(b)—15(b) in FIG. 15(a). As shown, a chromium (Cr1) layer to serve as gate electrodes 25 of TFTs is formed on the substrate 21. The wire portions 30c passing between the adjacent photodetecting elements in the wire group 13 are also made of the CR1. The remaining portions of the wire group 13, made of aluminum, may be formed on an insulating layer of polyimide, for example, with provision of contact portions 36 for the insulating layer 26. A method of manufacturing the wire groups 13 will be described. When a Cr1 layer is formed on a substrate 21 and a pattern of gate electrodes 25 of the TFTs is formed, each wire portion 30c lying between the adjacent photodetecting elements is also patterned by photolithographic etching process. After the photodetecting elements 11″ and the charge transfer section 12 are formed, contact portions 35 are provided, and other wire layers 30 made of aluminum are formed on an insulating film made of polyimide, for example.

In the instant embodiment, the wires each lying between the adjacent photodetecting elements are formed by using the chromium (Cr1) layer under the upper metal electrodes 22. Therefore, there is no need to widen the distance between the adjacent photodetecting elements. This fact eliminates the performance degradation of the image sensor owing to the lowered resolution, and lessens the coupling capacitance between the electrode of each photodetecting element and the wire portion 30c. As a result, the charges stored in the wire capacitors in the wire groups 13 can be exactly read therefrom. The conventional manufacturing process, not greatly modified, is available for manufacturing the image sensors of the invention. Since the wires lie on the layer under the metal electrodes 22 of the photodetecting elements, the wire width of the wire portion may be selected without restriction. Since a fixed bias voltage is applied to the metal electrodes 22, the electrodes 22 can protect the wire portions 30c lying between the adjacent photodetecting elements against any adverse effect (crosstalk) by the voltage variation in the photodetecting elements adjacent thereto.

Figure 16:
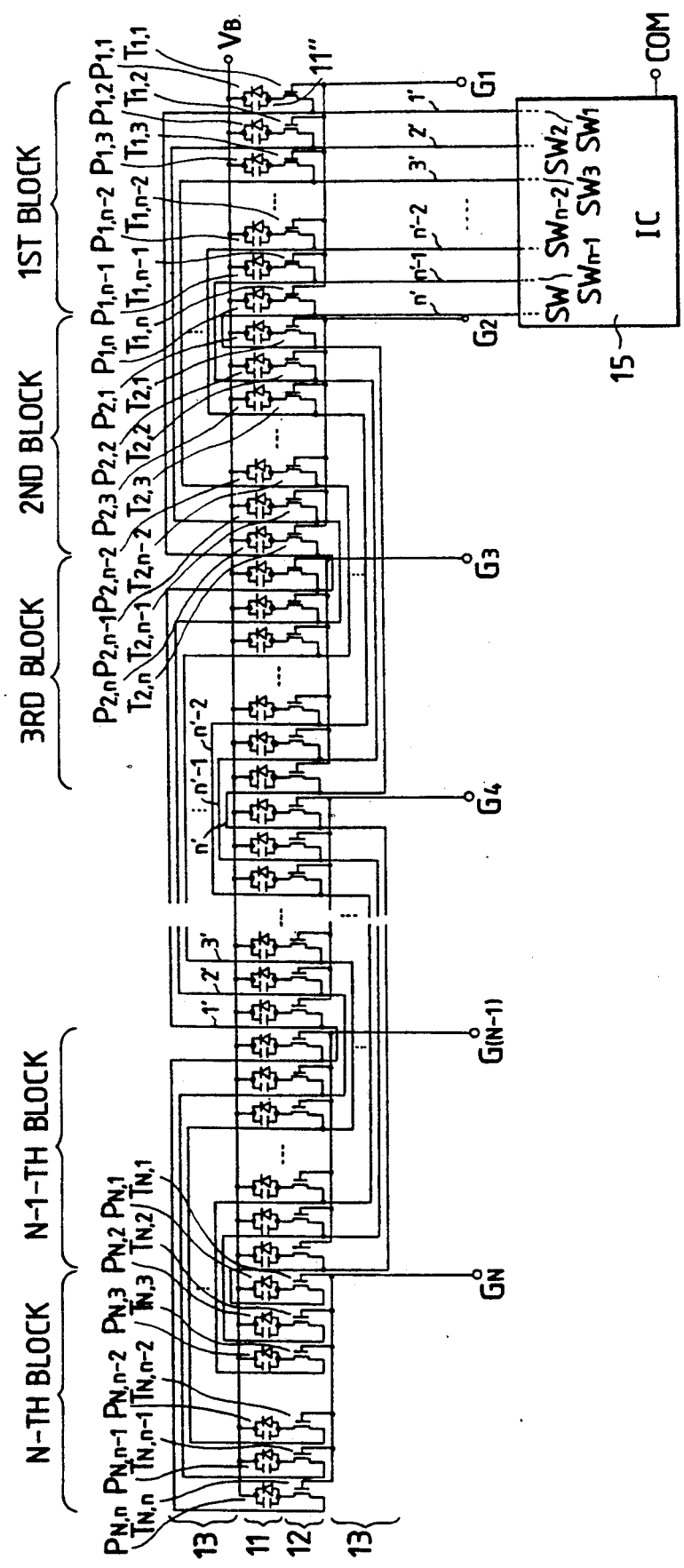
FIG. 16 is an equivalent circuit diagram of a color image sensor with a single drive IC according to yet another embodiment of the present invention.

As shown in an equivalent circuit of FIG. 16, a single drive IC may be used for outputting the image signals. As already described, to output the image signals using a single drive IC, the charge read order for the odd-numbered blocks is reverse to that for the even-numbered blocks. To cope with this, the image signals are temporarily stored in a memory (not shown) of an external circuit, and the output order of the image signals is changed and time-sequentially outputted. In this embodiment, the required number of drive ICs is reduced from two to one. This fact leads to cost reduction, reduction of the space portion of the sensor portion, and improvement of a production yield resulting from the number of the wire bondings.

Figure 17:
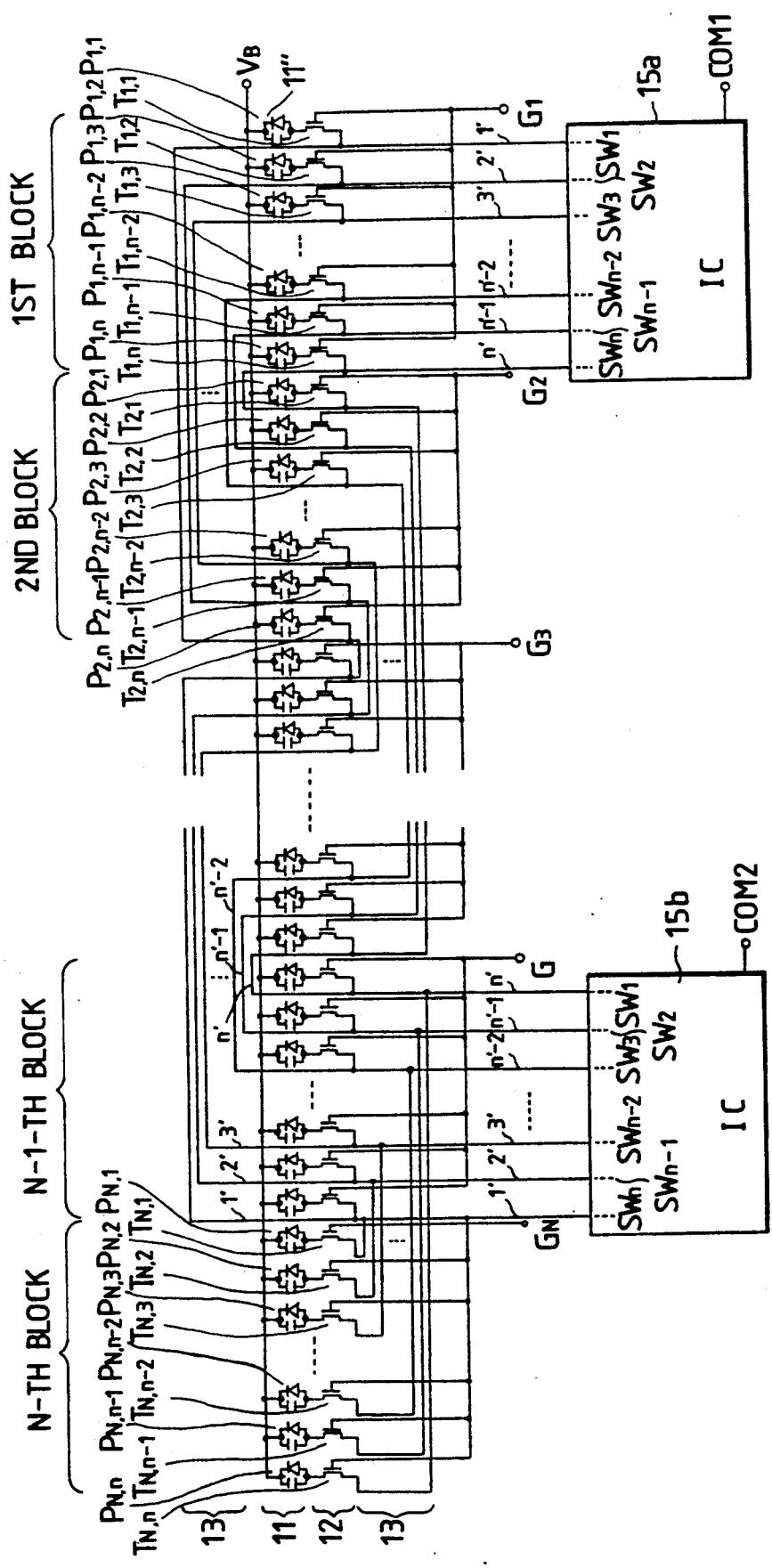
FIG. 17 is an equivalent circuit diagram of a color image sensor according to still another embodiment of the present invention.

In the image sensors of the embodiments mentioned above, the N-th block is an even-numbered block. In a case where the N-th block is the odd-numbered block as shown in FIG. 17, a drive IC 15b is provided under the thin film transistors TN-1,1 to TN-1,n of the N-1-th block. If the drive ICs 15a and 15b are interconnected as shown in FIG. 12, it is possible to selectively output only the charges on the even-numbered blocks from the output line COM2 of the drive IC 15b. If the drive IC 15b is disposed on the upper side of the thin film transistors TN,1 to TN,n of the N-th block, as shown in FIG. 18, and the drive ICs 15a and 15b are interconnected as shown in FIG. 12, it is possible to selectively output only the charges on the even-numbered blocks from the output line COM2 of the drive IC 15b.

Figure 18:
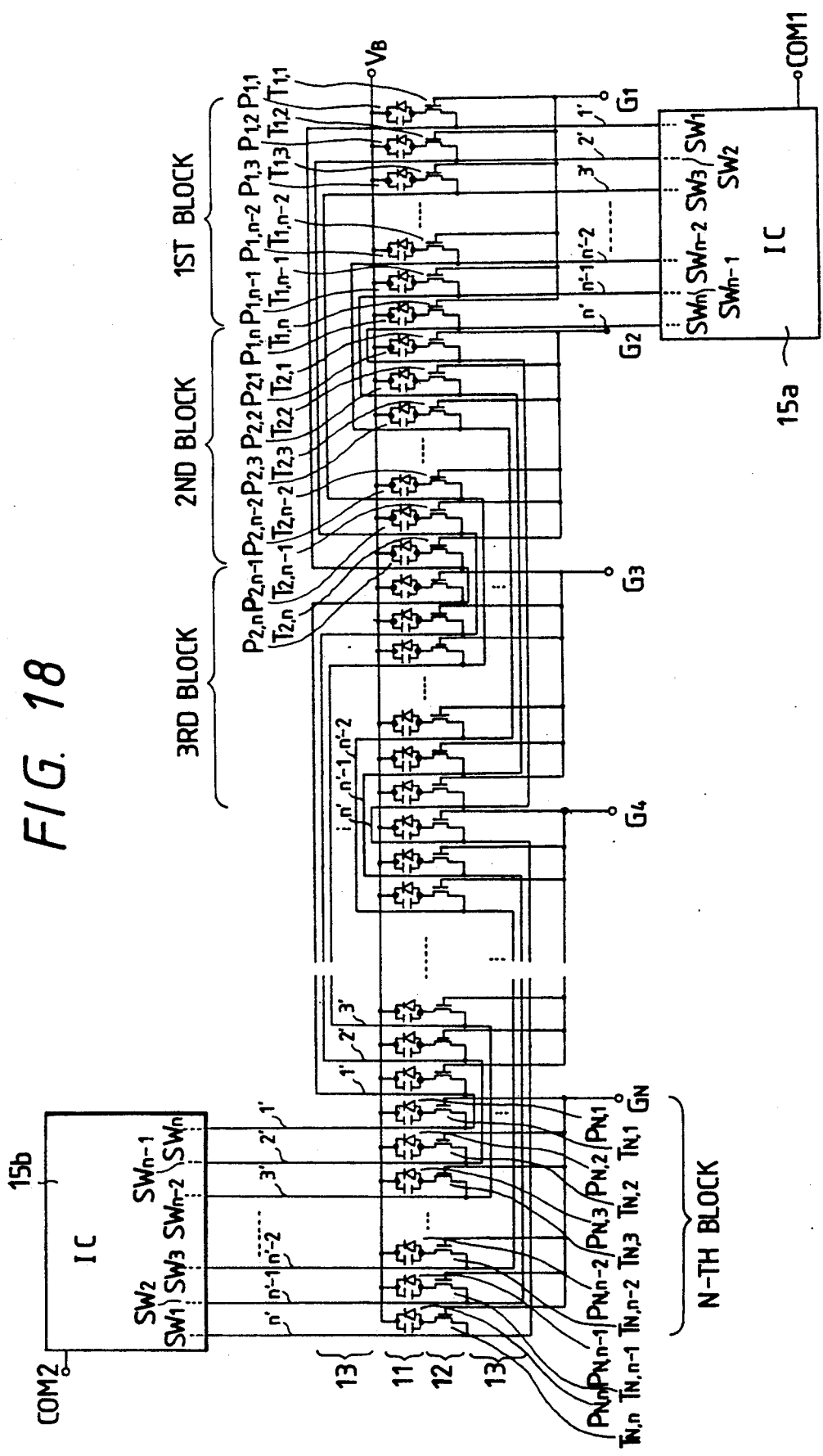
FIG. 18 is an equivalent circuit diagram of a color image sensor according to an additional embodiment of the present invention.

It is evident that the single-drive IC construction shown in FIG. 16, and the arrangements of FIGS. 17 and 18 in which the N-th block is the odd-numbered block are applicable to the color image sensor.

Additionally, if ground lines are wired among the signal lines parallel the signal lines, the crosstalk interference between the signal lines running parallel to each other is reduced, and the wire capacitors of the signal lines may be increased.

Figure 19:
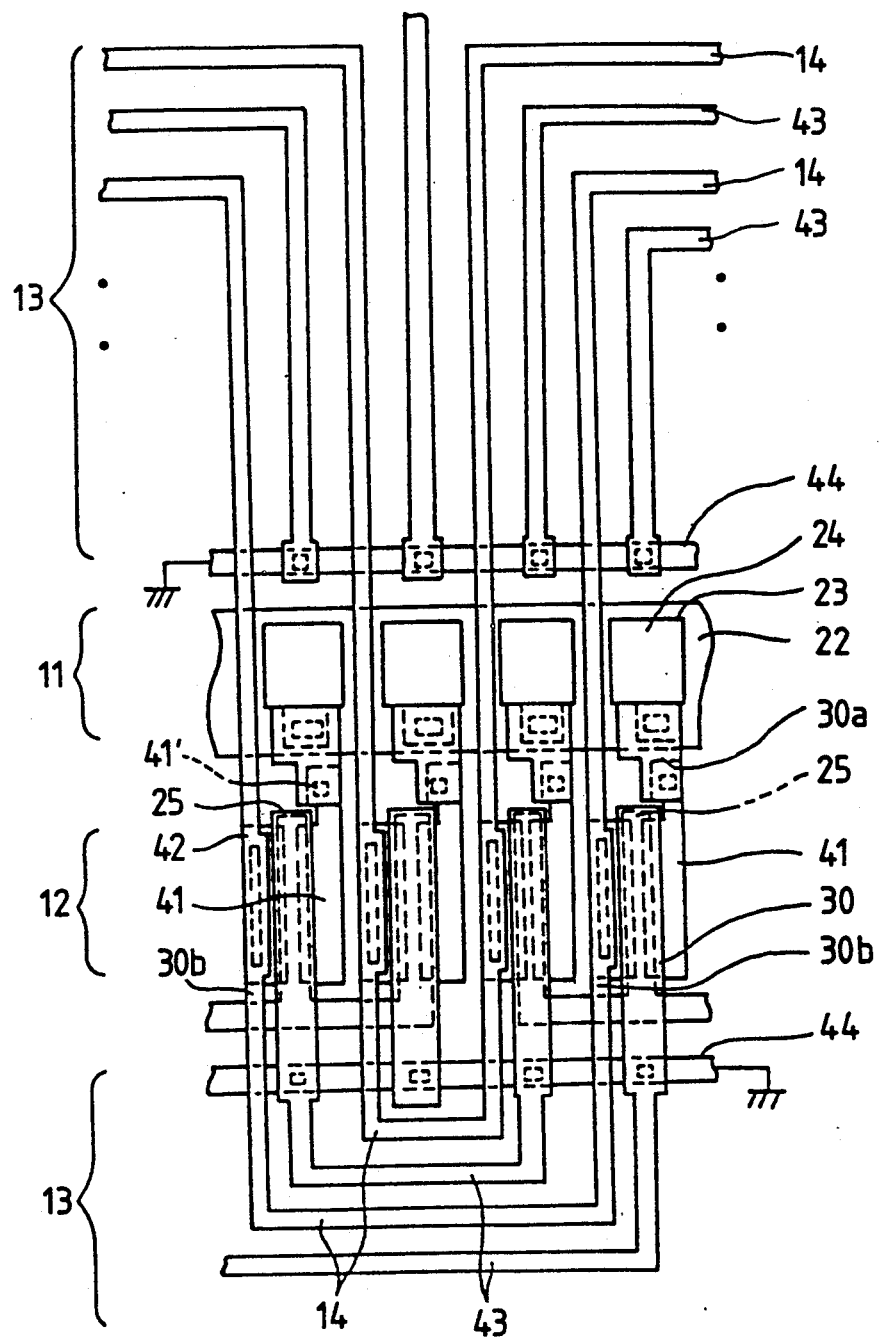
FIG. 19 is a plan view showing another construction of the image sensor that can be expressed by the equivalent circuit shown in FIG. 5.

FIG. 19 is a plan view showing another construction of the image sensor that can be expressed by the equivalent circuit shown in FIG. 5. In FIG. 19, the same reference numerals are used for designating like or equivalent portions of the image sensor shown in FIG. 6. In the image sensor of this embodiment, wires set at a fixed potential lie among the signal lines. The fixed-potential wires will be described with reference to FIGS. 19 and 20.

Figure 20:
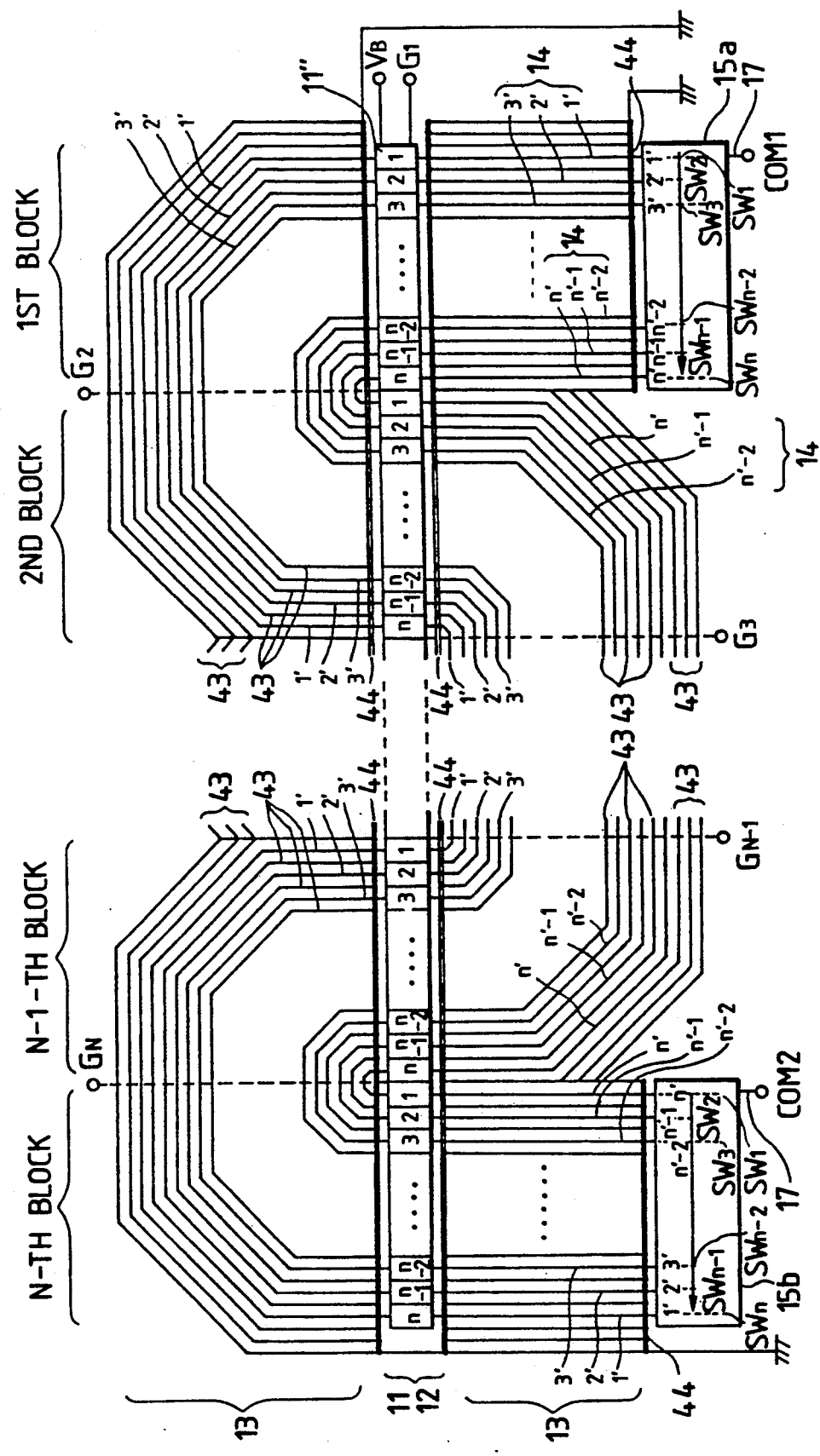
FIG. 20 is a block and wiring diagram showing a layout of the wire group of the image sensor of FIG. 19.

The fixed-potential wires lying among the signal lines may be ground lines connected (grounded) to earth. As shown in FIG. 20, each ground line 43 is disposed between the adjacent signal lines parallel to one another, meandering through the photodetecting element array 11. The ground lines 43 are formed of the same metal layer as that of the signal lines. In design, the pitch of the ground lines is selected to be preferably equal to that of the signal lines.

In the instant embodiment, the ground lines 43 are connected to wires 44 made of chromium (Cr1) connected to earth lines, provided on the upper and lower sides of the photodetecting element array 11. Also in the portions where the signal lines 14 are connected to the drive ICs 15a and 15b, the ground lines 43 are disposed among the common signal lines 14, and are connected to wires 44, provided close to the drive ICs 15a and 15b.

A specific construction of the ground lines 43 near the photodetecting elements 11'', the thin film transistors of the charge transfer section 12, and the photodetecting element array 11, will be described with reference to FIG. 19. On the upper side of the photodetecting element array 11, the ground lines 43 are disposed among the common signal lines 14, and extend along the common signal lines 14 and connect the blocks, like the common signal lines 14 connecting the blocks. The ends of the ground lines 43 are connected, through contact holes, to the wire 44 made of chromium (Cr1) connected to the earth line which is disposed close to the upper side of the photodetecting element array 11 and extends in the main scan direction.

The ground lines 43 on the lower side of the photodetecting element array 11, disposed among the common signal lines 14, are formed so that the ground lines lead to the lower side of the photodetecting element array 11 from aluminum layers 30 as a light shield metal layer to shield the a-Si: H layer of the thin film transistors from light. The ground lines 43 extend along the common signal lines and connect the blocks, like the common signal lines 14 connecting the blocks. Each ground line 43 extends from the associated aluminum layer 30 as the light-shield metal layer in one block, and connects to the associated aluminum layer 30 in the block adjacent thereto. The ends of the ground lines 43 are connected, through contact holes, to the wire 44 made of chromium (Cr1) connected to the earth line which is disposed close to the lower side of the photodetecting element array 11 and extends in the main scan direction.

As seen from FIG. 20, showing a layout of wiring groups, in this instance, three ground lines 43 are disposed outside the signal line (signal line 1' or signal line n'), furthest apart from the photodetecting element array 11. The reason why the three ground lines are provided follows. The signal line furthest apart from the photodetecting element array 11 forms a load capacitor in cooperation with only one of the ground lines 43, while the inner signal lines each form a load capacitor in cooperation with both of the ground lines 43. Therefore, the load capacitors of the image sensor are not uniform. To set up substantially the load capacitor forming condition as that of the inner signal lines, the three ground lines are additionally formed. The use of the three ground lines makes the load capacitors uniform in value, and ensures exact charge outputting.

Although the instant embodiment uses the three ground lines located outermost, the number of the outermost ground lines is selected depending on the required load capacitance calculated. The load capacitance can be calculated taking into consideration many factors, such as total wire length, wire width, wire pitch, wire material, and insulating layer material.

In the illustration of FIG. 20, the wire group 13 consists of vertical, horizontal and oblique wires. Such a layout of the wires is employed for reducing the total wire length in the wire group 13.

A method of manufacturing the image sensor thus constructed will be described.

To start, a first chromium (Cr1) layer of approximately 750Å thickness to serve as gate electrodes 25, and wires 44 which are to be formed on both sides of the photodetecting element array 11 and close to the drive ICs 15a and 15b, and to be connected to the earth lines, are formed on a substrate 21 of glass, for example, which has been inspected and washed, by the DC sputtering method. The Cr1 layer is patterned by a photolithographic process and an etching process. The structure is subjected to the BHF process, and the alkali cleaning. Following this step, in order to form on the Cr1 pattern an insulating layer 26 for the thin film transistor (TFT) portion, semiconductor active layers 27 layered on the insulating layer, and additional insulating layers 29 layered on the semiconductor active layers, a silicon nitride (SiNx) film of approximately 3000Å thickness, an amorphous silicon hydride (a-Si: H) of approximately 500Å thickness, and a silicon nitride film (SiNx) of approximately 1500Å thickness are formed in this order by the plasma CVD (P-CVD) method, while maintaining a vacuum state. The lower insulating layer 26 in the TFT is referred to as a bottom-SiNx (b-SiNx) film, and the top insulating layer 29 is referred to as a top-SiNx (t-SiNx) film. In this case, as those layers are continuously formed while keeping the vacuum state, the interfaces each between them can be kept clean and hence a better S/N ratio of the resultant image sensor product can be gained.

The conditions for forming the b-SiNx film by the P-CVD method are: substrate temperature of 300° to 400° C., gaseous pressure of $SiH_4$ and $NH_3$ of 0.1 to 0.5 Torr, $SiH_4$ flow rate of 10 to 50 sccm, $NH_3$ flow rate of 100 to 300 sccm, and RF power of 50 to 200 W.

The conditions for forming the a-Si: H film by the P-CVD method are: substrate temperature of 200° to 300° C., $SiH_4$ gaseous pressure of 0.1 to 0.5 Torr, $SiH_4$ flow rate of 100 to 300 sccm, and RF power of 50 to 200 W.

The conditions for forming the t-SiNx films by the P-CVD method are: substrate temperature of 200° to 300° C., gaseous pressure of $SiH_4$ and $NH_3$ of 0.1 to 0.5 Torr, $SiH_4$ flow rate of 10 to 50 sccm, $NH_3$ flow rate of 100 to 300 sccm, and RF power of 50 to 200 W.

To conform the top insulating layers 29 to a pattern of the gate electrodes 25, the top insulating layers 29 are patterned in the following manner. The upper surface of the top insulating layers 29 is coated with resist. With a mask of the pattern of the gate electrodes 25, the rear side of the substrate 21 is exposed to light for removal of the resist film.

Subsequently, the structure is subjected to the BHF process, and an n+a-Si: H layer as an ohmic contact layer 28 is deposited thereon, to approximately 1000Å thickness by the P-CVD method. A second chromium (Cr2) layer, which is to be used as the drain electrodes 41 and the source electrodes 42 of the TFTs, and the lower metal electrodes 22 of the photodetecting elements 11", is deposited, to 1500Å thickness, by the DC magnetron sputtering method. An a-Si: H layer to be used as the photoconductive layers 23 of the photodetecting elements 11" is deposited, to approximately 13000Å thickness, by the P-CVD method. An ITO film to be used as the transparent electrodes 24 of the photodetecting elements 11" is deposited, to approximately 600Å thickness, by the DC magnetron sputtering process. Before the deposition of these films, the alkaline cleaning is required for the surfaces on which the films are to be deposited.

Afterwards, to form the discrete transparent electrodes 24 of the photodetecting elements 11", the ITO film is patterned by the photolithographic process and the etching process. Using the same resist pattern, the a-Si: H layer for the photoconductive layers 23 is patterned by a dry-etching process. The chromium (Cr2) layer for the metal electrodes 22 serves as a stopper and is left not patterned. Since the a-Si:H layers of the photoconductive layers 23 are side-etched greatly during the dry-etching process, the ITO film is again subjected to the etching process before the resist film removal. The ITO film is further etched from its periphery of the rear side, so that the resultant ITO film has a size equal to that of the a-Si: H layer of the photoconductive layer 23.

The conditions for forming the a-Si: H film by the P-CVD method are: substrate temperature of 170° to 250° C., SiH$_4$ gaseous pressure of 0.3 to 0.7 Torr, SiH$_4$ flow rate of 150 to 300 sccm, and RF power of 100 to 200 W.

The conditions for forming the ITO film by the DC sputtering method are: gaseous pressure of Ar and O$_2$ of $1.5 \times 10^{-3}$ Torr, Ar gas flow rate of 100 to 150 sccm, O$_2$ gas flow rate of 1 to 2 sccm, and DC power of 200 to 400 W.

The chromium layer Cr2, to be used as the chromium layers of the metal electrodes 22 of the photodetecting elements 11" and the chromium layers of the drain electrodes 41 and the source electrodes 42 of the TFTs, is patterned by the photolithographic process and the etching process. The n+a-Si: H layer serving as the lower layer for the chromium layers of the metal electrodes 22 of the photodetecting elements 11, and the n+a-Si: H layer for the ohmic contact layers 28 of the TFTs are both etched by using the same resist pattern.

Next, to form a pattern of the gate insulating layers 26 of the TFTs, the b-SiNx layer is patterned by a photolithographic etching process. An insulating layer of polyimide of approximately 11500Å thickness is applied so as to cover the image sensor, and the structure is pre-baked and subjected to photolithographic etching process to form contact portions, and is baked again. As a result, in the photodetecting elements 11", the following portions are formed; the contact portions to supply electric power to the metal electrodes 22 and the portions to pull charges out of the transparent electrodes 24. In the TFTs, the wires 30a for transferring charges generated in the photodetecting elements 11", the contact portions leading the charges to the signal lines, and the contact portions connecting to the wires 44 by which the ground lines 43 are connected to the earth lines are formed. Thereafter, to completely remove the polyimide left on the contact portions, the structure is subjected to Descum process by which it is placed in a plasma atmosphere of O$_2$.

Subsequently, an aluminum (Al) layer of 15000Å thickness is deposited so as to entirely cover the image sensor by the DC magnetron sputtering method. The structure is subjected to the photolithographic etching process to form a desired pattern. As a result, in the photodetecting elements 11", a wire pattern including the wire portions to supply electric power to the metal electrodes 22, and the wire portions 30a to pull charges out of the transparent electrodes 24 and to connect to the drain electrodes 41 of the TFTs are formed. In the wire groups 13, a pattern of the common signal lines 14 connecting to the source electrodes 42 of the TFTs, and a pattern of the ground lines 43 are formed.

Finally, the structure is coated with polyimide to serve as a passivation layer (not shown). The polyimide coated structure is pre-baked, subjected to photolithographic etching process for patterning, and is further baked to form the passivation layer. The resultant structure is subjected to the Descum process to remove the polyimide still left.

Thereafter, the drive ICs 15a, 15b and the like are mounted, and wire bonding and assembling work are performed to complete the image sensor.

The common signal lines 14, entirely made of aluminum (Al), are patterned so that they meander through the photodetecting element array 11 or the lines of the photodetecting element arrays in a zig-zag fashion, while being connected at specific points to the source electrodes 42 of the TFTs. Accordingly, the resistance of the signal lines may be reduced.

The wire groups 13 may have another construction. In the construction, only the wire portions of the wire groups 13, each lying between the adjacent photodetecting elements 11" and 11", are formed in the same step to form the chromium (Cr1) pattern of the gate electrodes 25. The remaining wire portions of the wire groups, made of aluminum, are formed through contact holes formed in the insulating layers 26. In this case, the wires 44, which connect to the earth lines provided on both sides of the photodetecting element array 11, are formed, like the wire groups 13, of the aluminum layer on the insulating layer 26, not of the chromium (Cr1) layer forming the gate electrodes 25.

With the construction of the wire groups, even in such a case where the space between the adjacent photodetecting elements 11" and 11" is not satisfactorily wide, if the Cr1 layer is used for the wires, each wire may be formed between the adjacent photodetecting elements 11" and 11". Additionally, since a fixed bias voltage is applied to the metal electrodes 22 of the photodetecting elements 11", the metal electrodes 22 may protect the Cr1 wires from any adverse influence (crosstalk) by the voltage variation in the adjacent photodetecting elements 11".

Figure 21:
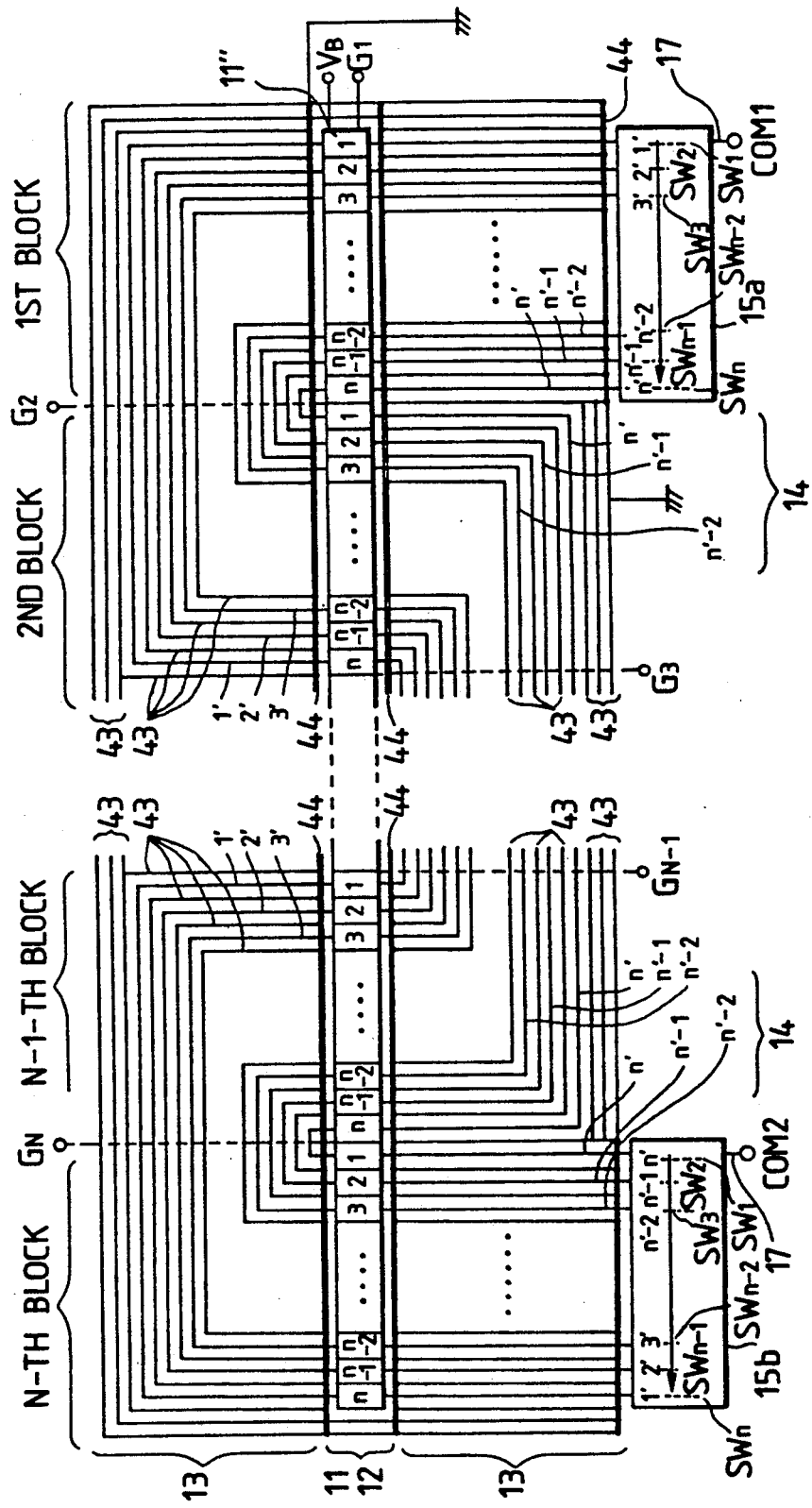
FIG. 21 is a block and wiring diagram showing another layout of the wire group of the image sensor of FIG. 19.

The construction of FIG. 20 may be modified into the construction shown in FIG. 21 showing a layout of the wire group. The construction of FIG. 21 may further increase the load capacitance in the wire group 13, because the FIG. 21 construction further elongates the total wire length.

Since the two drive ICs 15a and 15b are provided under the photodetecting element array 11, the signal lines 14 of the wire group 13 become longer in the order of the signal line n' to the signal line 1, That is, the signal line 1' is the longest in those signal lines. Accordingly, the load capacitances of the signal lines 14 also become larger in the ID order of the signal line n' to the signal line 1'. The load capacitances of the common signal lines 14, which are different from one another, may be made uniform in the following way. In the portion of the common signal lines 14 close to the drive IC 15b, the common signal lines 14 become longer in the order of the signal line 1' to the signal line n' so that the total lengths of those lines are equal to each other. In this way, the load capacitances of the common signal lines 14 are uniform in value. In this instance, the different load capacitances of the common signal lines are corrected to be uniform by adjusting the signal line lengths in the portion of the signal lines close to the drive IC 15b. The same affect can be realized by changing the widths of the signal lines in the portion of the signal lines close to the drive IC 15b.

Figure 22A:
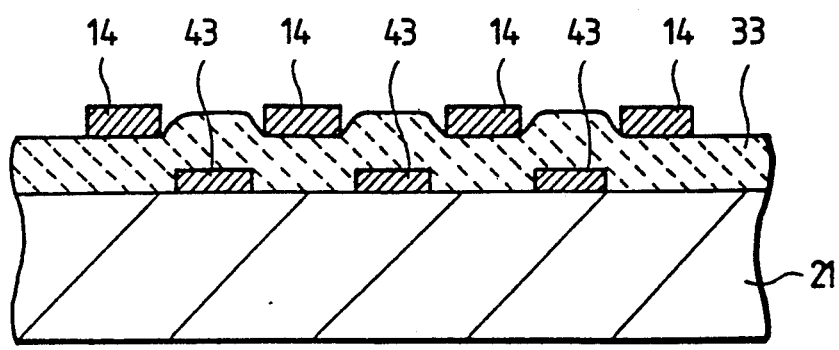
FIG. 22(a) is a sectional view showing the structure of an additional wire group of the image sensor.

An additional correction of the load capacitances of the common signal lines 14 will be described. As shown in FIG. 22(a) which is a cross sectional view of the wire portion, ground lines 43 made of chromium are formed on the substrate 21, and each disposed between the adjacent aluminum common signal lines 14 which exist above the ground lines, with an insulating layer 33 interlayered between them. Overlap areas of the short signal lines with the ground lines 43 are increased, while that of the long signal lines are decreased. In this way, the load capacitances of the common signal lines 14 are made uniform in value. Specifically, in this instance, the overlap areas of the signal lines with the ground lines are designed to become larger in the order of the signal line 1' to the signal line n'. The construction in which the chromium ground lines 43, formed on the substrate 21, are each disposed between the adjacent signal lines located above the ground lines through the insulating layer, is applicable for either a part or the entirety of the wire group 13. Another load capacitance correction will be described with reference to FIG. 22(b) which is a cross sectional view of the wire portion. As shown, the aluminum ground lines 43 are each disposed between the adjacent common signal lines 14 of aluminum which are located under the ground lines with an insulating layer 33b interposed therebetween. Overlap areas of the short signal lines with the ground lines 43 are increased, while those of the long signal lines are decreased. In this way, the load capacitances of the common signal lines 14 are made uniform in value.

Figure 22B:
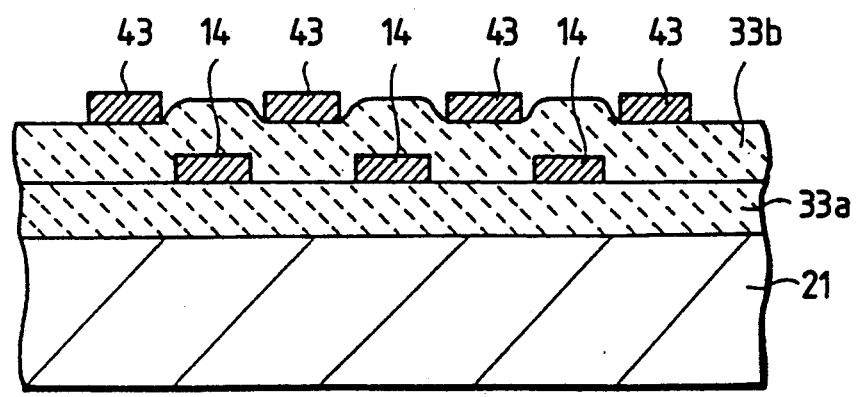
FIG. 22(b) is a sectional view showing the structure of further wire group.

In the constructions illustrated in the cross sectional views of FIGS. 22(a) and 22(b), the layer of the signal lines is different from that of the ground lines 43. These constructions are applied for a case where the space between the signal lines is narrow, and for a case where the ground lines 43, each located between the adjacent signal lines, cannot be formed by the same aluminum layer. The constructions contribute a little to the crosstalk reduction.

An image sensor of which the size is small but the load capacitance is large, may be realized by using a pattern of a metal layer (e.g., an earth layer), fixed at a potential, which is layered above or under the wire groups 13, covering the same. In this case, the load capacitance may be increased if the ground line 43 is provided between the adjacent signal lines 14 or is not provided.

Figure 23:
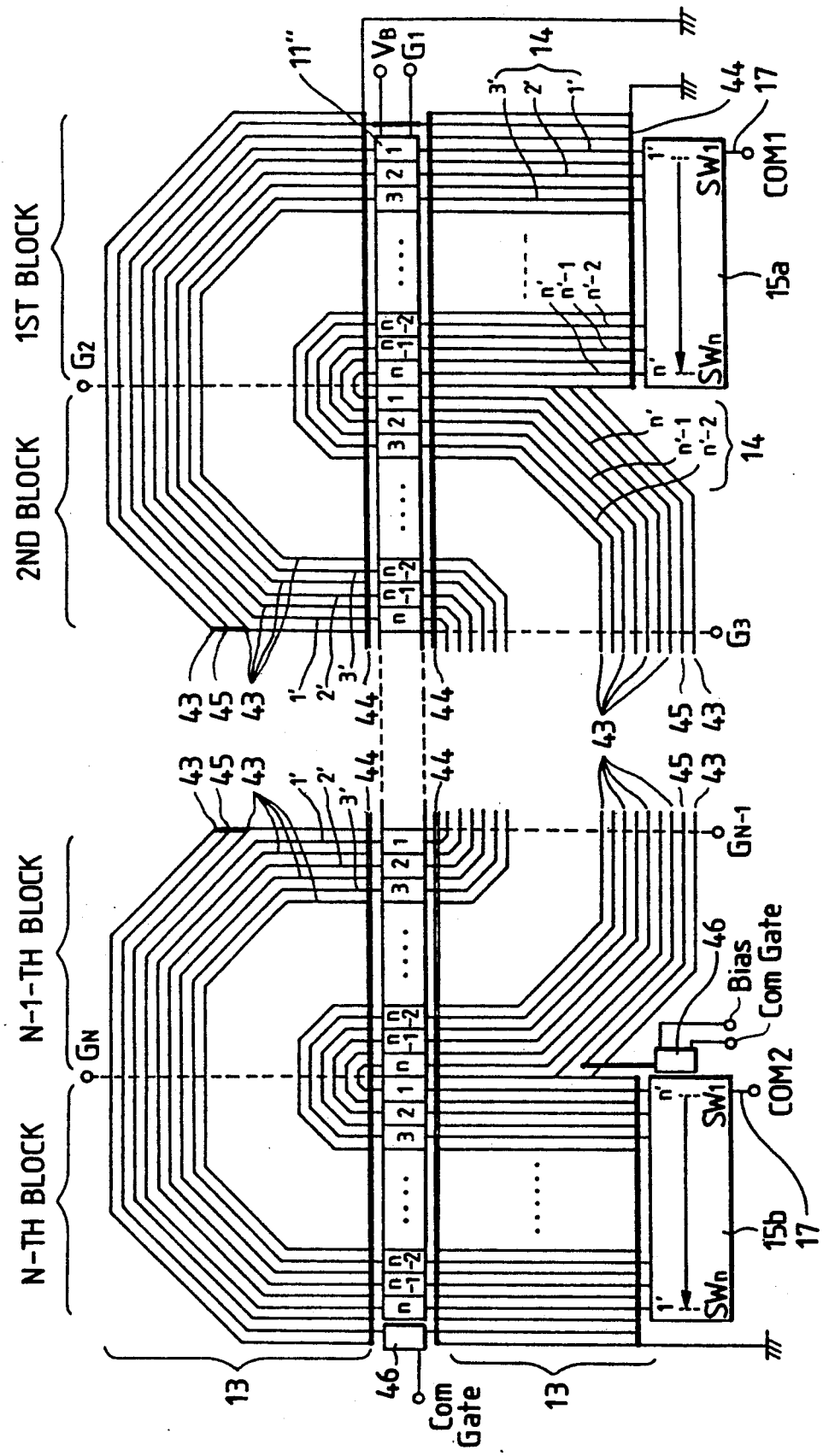
FIG. 23 is a block and wiring diagram showing further layout of the wire groups of the image sensor.

In the above-mentioned embodiment, in order to make uniform the load capacitance values of the signal lines 14, the three ground lines 43 are provided outside the signal line (signal line 1' or n') furthest most apart from the photodetecting element array 11. A construction of the wire group shown in FIG. 23 ensures a more exact charge read. In such a construction, the middle line of the three ground lines 43 located outside the outermost signal line is connected to a thin film transistor (TFT) switching element and used as a dummy line 45. Potential in the dummy line 45 is varied so that a phenomenon of an instantaneous potential rise in the general signal line when it receives a gate pulse, called a feed-through phenomenon, occurs also in the dummy line. The instant wire-group construction thus operated can exactly output the charges in the same condition as that of the inner signal lines of the wire group 13.

The operation of the dummy line 45 connecting with the TFT is driven in connection with a gate pulse $\phi G1$ for the first block to a gate pulse $\phi Gn$ for the N-th block. The TFT connected with the dummy line 45 is turned on and off in synchronism with the charge transfer in each block. In this instance, a dummy photo diode is also connected to the TFT of the dummy line 45, to form a potential varying means 46. The dummy photo diode is not used for receiving light.

Figure 24:
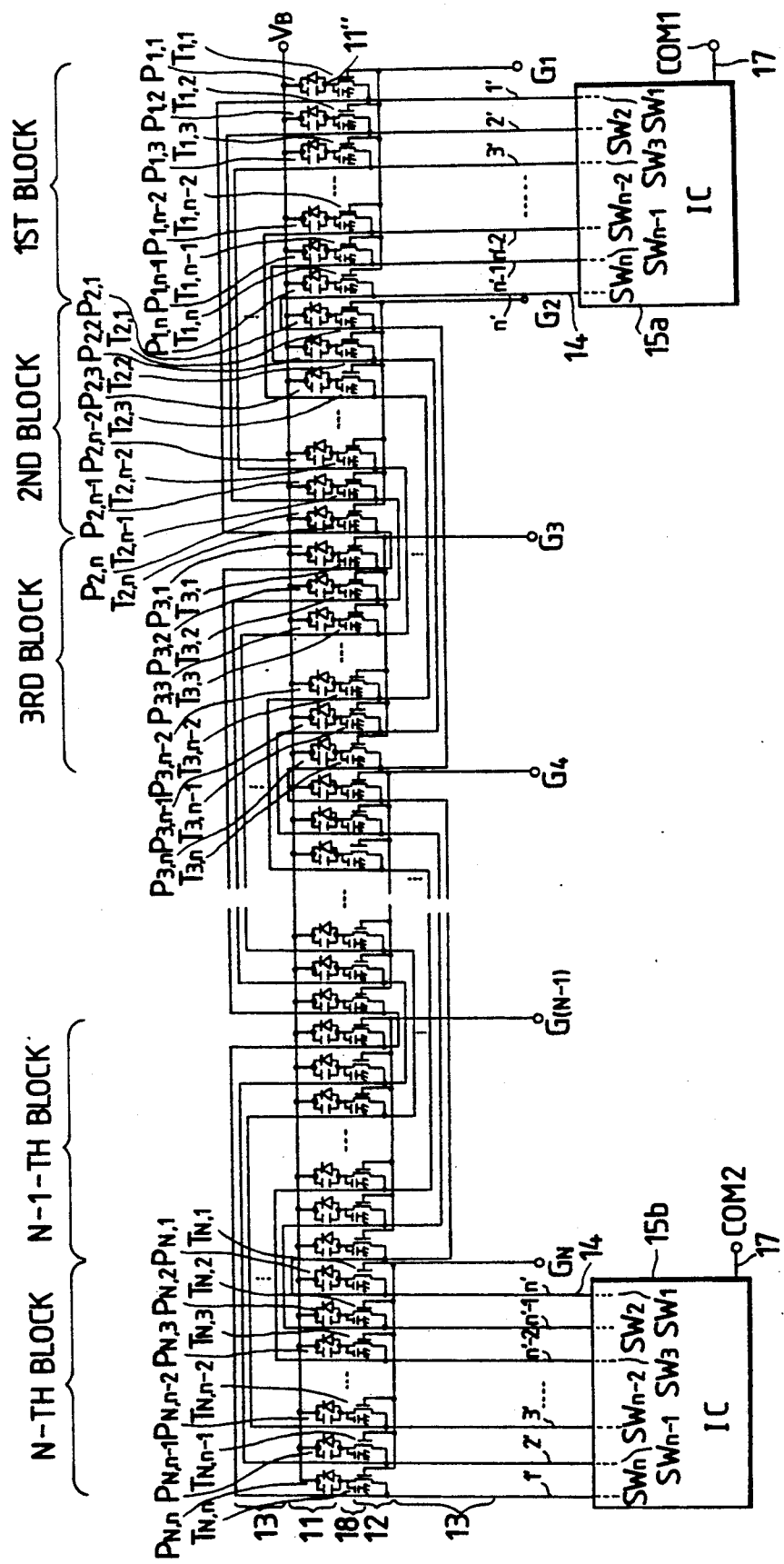
FIG. 24 is an equivalent circuit diagram of an image sensor according to an additional embodiment of the present invention.
Figure 25:
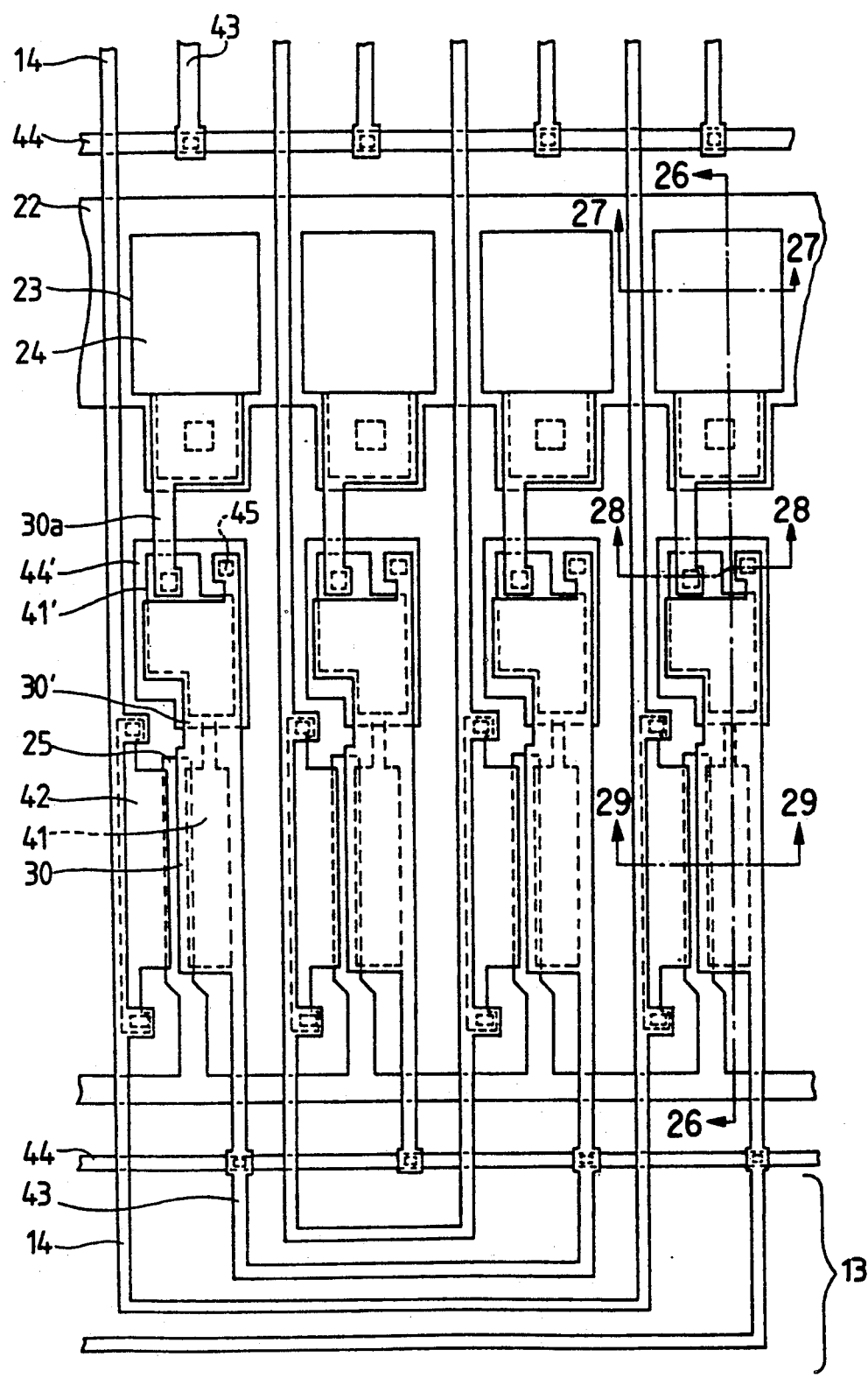
FIG. 25 is a plan view showing a partial structure of the image sensor of FIG. 24 in which photodetecting elements, a charge transfer section, and a wiring structure are included.
Figure 26:
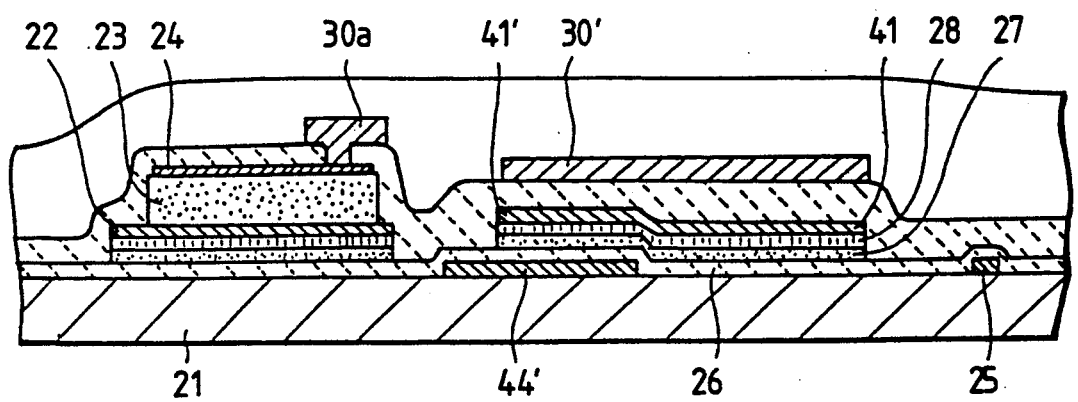
FIG. 26 is a cross sectional view taken on line 26—26, in FIG. 25.

FIG. 24 is an equivalent circuit diagram of an image sensor according to an additional embodiment of the present invention. FIG. 25 is a plan view showing a partial structure of the image sensor in which photodetecting elements, additional capacitors, a charge transfer section, and a wire group are included. FIG. 26 is a cross sectional view taken on line 26—26 in FIG. 25.

As shown, the color image sensor includes a photodetecting element array 11 (containing photo diodes P1,1 to PN,n) consisting of N number of blocks, each block being a group of "n" number of sandwich type photodetecting elements 11" (photo diodes P) arrayed on an insulating substrate made of glass, for example. The color image sensor further includes an additional capacitor array 18 consisting of additional capacitors CCi,j (i=1 to N, j=1 to n), a charge transfer section 12 of thin film transistors T1,1 to TN,n coupled with the photodetecting elements 11" through the additional capacitors CCi,j, a wire group 13 for connecting the thin film transistors in the charge transfer sections 12 between the adjacent blocks, "n" number of common signal lines 14, led from the charge transfer sections 12 through the multilayered wire group 13, corresponding to the photodetecting element groups in the blocks, and drive ICs 15a and 15b connected to the common signal lines 14. Each of the ICs 15a and 15b includes switches SW1 to SWn for transferring the potentials on "n" number of the common signal lines 14 onto an output line 17 (COM1 or COM2) in a time-sequential manner.

Figure 27:
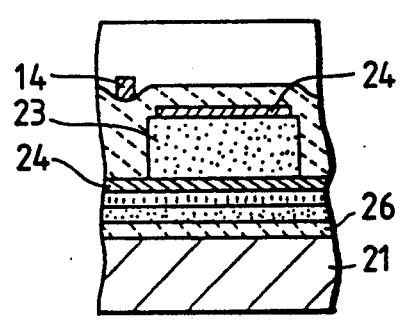
FIG. 27 is a sectional view taken on line 27—27 in FIG. 25.

As shown in FIG. 25 and FIG. 27 showing a sectional view taken on line 27—27 in FIG. 25, each photodetecting element 11" has a sandwich structure including an insulating layer 26 of silicon nitride (a-SiNx 1), an amorphous silicon hydride (a-Si: H) layer, an n+amorphous silicon hydride (n+a-Si: H) layer, a strip-like metal electrode 22, a photoconductive layer 23, and an upper transparent electrode 24, which are layered in this order on a substrate 21 made of glass, for example. The metal electrode 22 made of chromium (Cr2) serves as a common electrode under the photodetecting elements 11". The photoconductive layer 23 is made of amorphous silicon hydride (a-Si: H) and separately formed for each photodetecting element (bit) 11". The upper transparent electrode 24 is made of indium tin oxide (ITO) and is separately formed for each photodetecting element.

Figure 28:
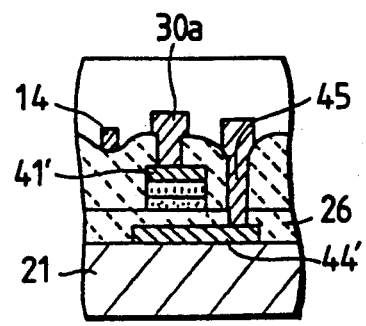
FIG. 28 is a sectional view taken on line 28—28, in FIG. 25.

As shown in FIG. 25 and FIG. 28 showing a cross sectional view taken on line 28—28 in FIG. 25, the additional capacitor CCi,j provided closer to the photodetecting elements 11" includes a lower metal layer 44' formed of a chromium layer (Cr1) on the substrate 21, the silicon nitride (a-SiNx1) film used as the insulating layer 26 for the gate electrode 25 and layered on the lower metal layer 44', amorphous silicon hydride (a-Si: H) layer as a semiconductor active layer 27, the n+amorphous silicon hydride (N+a-Si: H) as an ohmic contact layer 28, a square lead portion 41' formed of a chromium (Cr2) layer, and a square upper metal layer 30', extended from an aluminum layer 30, layered on a polyimide insulating layer on the lead portion. The aluminum layer 30 is a light-shield metal layer of the a-Si: H layer of the thin film transistors.

The wire 30a led from the transparent electrode 24 of the photodetecting element 11" is connected to the terminal of the lead portion 41' led from the drain electrode 41 of the thin film transistor Ti,j, and connects to the drain electrode 41 of the transistor Ti,j through the lead portion 41'.

A structure in which the a-SiNx 1 layer, the a-Si: H layer, and the n+a-Si: H layer are sandwiched between the square lead portion 41' and the square lower metal layer 44', forms a lower additional capacitor. A structure in which the polyimide insulating layer is sandwiched between the square lead portion 41' and the square upper metal layer 30', forms an upper additional capacitor. Thus, the lower additional capacitor and the upper additional capacitor make up the additional capacitor CCi,j. With such a structure of the capacitor, if the area of the capacitor Ci,j is small, a large capacitance can be obtained. The upper and lower metal layers 44' and 30' are interconnected through a through hole, to place both layers at the same potential. The upper metal layer 30' is connected to the ground line 43 for preventing crosstalk among the signal lines disposed in parallel by way of the aluminum layer 30 as the light-shield metal layer of the thin film transistor Ti,j, and finally comes in contact with the wire 44. That is, the lower metal layer 44' and the upper metal layer 30' are connected to the earth line. Since the lead portion 41 is sandwiched between the lower metal layer 44' and the upper metal layer 30', the lead portion 41' is shielded, preventing the crosstalk between the adjacent lead portions 41'.

In the additional capacitor Ci,j portion of the image sensor of the instant embodiment, the upper metal layer 30' is an extension from the aluminum layer 30 as the light-shield metal layer for the a-Si: H layer of the thin film transistor Ti,j, and further covers a part of the drain electrode 41 of the thin film transistor Ti,j. The lower metal layer 44', which is in the form of discrete layers in the instant embodiment, may be shaped like a strip stretching in the main scan direction. If the lower metal layer 44, for the common metal layer is connected to the earth line, the upper metal layer 30' may be discretely formed, apart from the aluminum layer 30.

Figure 29:
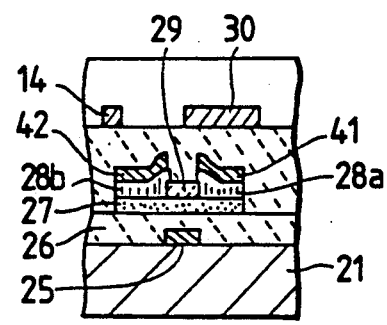
FIG. 29 is a sectional view taken on line 29—29, in FIG. 25.

As shown in FIG. 25 and FIG. 29, showing a cross section taken on line 29—29 in FIG. 25, the thin film transistor Ti, j, forming the charge transfer section 12 has an inverse staggered structure. As shown, a chromium (Cr1) layer as the gate electrode 25, a silicon nitride (a-SiNx1) film as the insulating layer 26 or the gate insulating film, an amorphous silicon hydride (a-Si: H) layer as the semiconductor active layer 27, a silicon nitride (a-SiNx 2) film as the top insulating layer 29 disposed opposing the gate electrode 25, an n+amorphous silicon hydride (n+a-Si: H) layer as the ohmic contact layer 28, and a chromium (Cr2) layer used for the drain electrode 41 and the source electrode 42 are successively layered on the substrate 21 in this order. The structure thus formed is connected to an aluminum layer 30 through an insulating layer of polyimide, for example.

If the light-shield aluminum layer 30 is not provided, light transmits through the top insulating layer 29 to the a-Si: H layer where an optoelectric conversion takes place. To prevent such a phenomenon, the layer 30 is provided. In the instant embodiment, the light-shield aluminum layer 30 is shaped to imperfectly shield the a-Si: H layer from light. The imperfect shield shape is employed for avoiding the following disadvantage. If the aluminum layer 30 is located close to the source electrode 42 of the thin film transistor Ti,j, a coupling capacitor is present between the source electrode 42 and the aluminum layer 30. The coupling capacitor increases the common electrode capacitance, so that the sensitivity of the image sensor is decreased.

The ohmic contact layer 28 is shaped to have a part layer 28a contacting the drain electrode 41 and a part layer 28b contacting the source electrode 42. The chromium (Cr2) layer on the contact layer is also shaped to the drain electrode 41 and the source electrode 42. The chromium (Cr2) layer is provided for protecting the structure during the evaporation of the aluminum for the wire layer or during the film forming process by the sputtering method in order to secure the n+a-Si: H characteristic of the ohmic contact layer 28.

The terminal of the lead portion 41' led from the drain electrode 41 is connected to the aluminum wire 30a connecting to the transparent electrode 24 of the photodetecting element 11". The aluminum layer of the common signal line 14 in the wire group 13 is connected to the source electrode 42. Another material, e.g., poly-Si, may be used for the semiconductor active layer 27.

In this case, if the aluminum layer 30 is designed so that it is wider than the drain electrode 41 and led outside to cover the electrode, the aluminum layer 30 shields the crosstalk between the drain electrode 41 of the thin film transistor and the source electrode 42 of the transistor adjacent to the former.

A method of manufacturing the image sensor thus constructed will be described.

To start, a first chromium (Cr1) layer to serve as gate electrodes 25, a first chromium (Cr1) layer to serve as additional capacitors CCi,j, and a first chromium (Cr1) layer to be used as the wires 44 formed on both sides of the photodetecting element array 11 and close to the drive ICs 15a and 15b, are formed to approximately 500 to 1000Å thickness, on a substrate 21 of glass (e.g., glass of Corning 7059), which has been inspected and washed by using a mixed liquid of ammonia, hydrogen peroxide and water, by the DC sputtering method. The Cr1 layer is patterned by a photolithographic process and an etching process using a mixed liquid of cerium nitrate, ammonium, perchloric acid, and water.

The structure is subjected to the BHF process, and the alkali cleaning. Following this step, in order to form on the Cr1 pattern an insulating layer 26 for the thin film transistor (TFT) portion, semiconductor active layers 27 layered on the insulating layer, and to form insulating layers 29 layered on the semiconductor active layers, a silicon nitride (a-SiNx1) film of approximately 2000 to 4000Å thickness, an amorphous silicon hydride (a-Si: H) of approximately 300 to 1000Å thickness, and a silicon nitride film (a-SiNx2) of approximately 1000 to 2000Å thickness are deposited in this order by the plasma CVD (P-CVD) method, while keeping a vacuum state.

The conditions for forming the a-SiNx1 film by the P-CVD method are: substrate temperature of 320° to 370° C., gaseous pressure of $SiH_4$ and $NH_3$ of 0.1 to 0.5 Torr, $SiH_4$ flow rate of 10 to 50 sccm, $NH_3$ flow rate of 100 to 300 sccm, and RF power of 50 to 200 W.

The conditions for forming the a-Si: H film by the P-CVD method are: substrate temperature of 260° to 280° C., $SiH_4$ gaseous pressure of 0.1 to 0.5 Torr, $SiH_4$ flow rate of 100 to 300 sccm, and RF power of 50 to 200 W.

The conditions for forming the a-SiNx2 films by the P-CVD method are: substrate temperature of 230° to 270° C., gaseous pressure of $SiH_4$ and $NH_3$ of 0.1 to 0.5 Torr, $SiH_4$ flow rate of 10 to 50 sccm, $NH_3$ flow rate of 100 to 300 sccm, and RF power of 50 to 200 W.

Thus, the substrate temperature for forming the films is lowered from the silicon nitride (a-SiNx1) film to the silicon nitride (a-SiNx2) film. Such a temperature difference impedes the discharge of the hydrogen that is impregnated into the films.

To conform the top insulating layers 29 to a pattern of the gate electrodes 25, the top insulating layer 29 is patterned in the following manner. The upper surface of the top insulating layer 29 is coated with resist. With a mask of the pattern of the gate electrodes 25, the rear side of the substrate 21 is exposed to light for removal of the resist film, by using the self-alignment method.

Subsequently, the structure is subjected to the BHF process, and an n+a-Si: H layer as an ohmic contact layer 28 is deposited thereon, to approximately 1000 to 2000Å thickness, at 240° to 260° C. in $SiH_4$ gas containing $PH_3$ of 1%, by the P-CVD method.

A second chromium (Cr2) layer, which is to be used as the drain electrodes 41 and the source electrodes 42 of the TFTs, the lower metal electrodes 22 of the photodetecting elements 11″, and a second chromium (Cr2) layer to serve as the lead portion 41′ led from the drain electrode of the additional capacitor CCi,j, are deposited, to 1000 to 2000Å thickness, at room temperature by the DC magnetron sputtering method. An a-Si: H layer to be used as the photoconductive layers 23 of the photodetecting elements 11″ is deposited, to approximately 1 to 1.5 μm thickness, by the P-CVD method. An ITO film to be used as the transparent electrodes 24 of the photodetecting elements 11″ is deposited, to approximately 500 to 1000Å thickness, by the DC magnetron sputtering method. Before the forming of those films, the alkaline cleaning is required for the surfaces on which the films are to be deposited.

The conditions for forming the a-Si: H film by the P-CVD method are: substrate temperature of 170° to 240° C., $SiH_4$ gaseous pressure of 0.3 to 0.7 Torr $SiH_4$ flow rate of 150 to 300 sccm, and RF power of 100 to 200 W.

The conditions for forming the ITO film by the DC sputtering method are: substrate temperature being at room temperature, and the DC sputtering method being a reactive sputtering method in which a target of indium oxide ($In_2O_3$) containing stannic oxide ($SnO_2$) of 10 mol % is made to react on with oxygen ($O_2$).

Afterwards, to form the discrete transparent electrodes 24 of the photodetecting elements 11″, the ITO film is patterned by the photolithographic process and the etching process using a mixed liquid of ferric oxide and hydrochloric acid. Using the same resist pattern, the a-Si: H layer for the photoconductive layers 23 is patterned by dry-etching process using a mixed gas of $CF_4$ and $O_2$. The chromium (Cr2) layer for the metal electrodes 22 serves as a stopper during the dry etching process and is not patterned. Since the a-Si: H layers of the photoconductive layers 23 are side-etched greatly during the dry-etching process, the ITO film is again subjected to the etching process before the resist film removal. The ITO film is further etched from its periphery of the rear side, so that the ITO film formed has the size equal to that of the a-Si: H layer of the photoconductive layer 23.

The chromium layer Cr2, which is to be used as the chromium layers of the metal electrodes 22 of the photodetecting elements 11″, and the chromium layers of the drain electrodes 41 and the source electrodes 42 of the TFTs, and the lead portion 41′ of the additional capacitor CCi,j, is exposed and developed to form a resist pattern by the photolithographic process. Then, it is patterned by the etching process using a mixed liquid of cerium nitrate, ammonium, perchloric acid, and water. The n+a-Si: H layer and the a-Si: H layer serving as the lower layer for the chromium layers of the metal electrodes 22 of the photodetecting elements 11, the n+a-Si: H layer for the ohmic contact layers 28 of the TFTs and the a-Si: H layer of the semiconductor active layer 27, n+a-Si: H layer and the a-Si: H layer to serve as the lower layer for the chromium layer of the lead portion 41′ of the additional capacitor CCi,j, are etched by using the same resist pattern, and then the resist is separated. The result is formation of patterns of the metal electrodes 22, the drain electrodes 41 and the source electrodes 42, and square lead portions 41′ led from the drain electrodes to the photodetecting element 11″ side, a pattern of the semiconductor active layers 27, and a pattern of the ohmic contact layer 28 having the part layers 28a contacting the drain electrodes 41 and the part layer 28b contacting the source electrodes 42.

Next, to form a pattern of the a-SiNx1 to be the insulating layer 26 of the gate electrodes of the TFTs, the a-SiNx1 layer is patterned by photolithographic etching process using a mixed gas of $HF_4$ and $O_2$. An insulating layer of polyimide of approximately 1 to 1.5 μm thickness is applied so as to cover the image sensor, and the structure is pre-baked at 160° C. and subjected to photolithographic etching process to form contact portions, and is baked again.

As a result, in the photodetecting elements 11″, the following portions are formed; the contact portions to supply electric power to the metal electrodes 22, and the contact portions for connecting the wires 30a from the transparent electrodes 24 to the additional capacitors CCi,j. In the additional capacitor Ci,j, the contact portions for connecting the wires 30a from the transparent electrodes 24 to the lead portions 41′, and contact hole portions between the lower metal layers 44′ and the upper metal layers 30′ are formed. In the TFTs, the contact portions providing the connection from the source electrodes 42 to the wire groups 13 are formed.

In the wire group 13, the contact portions providing the connection from the ground lines 43 to the wires 44 earthed are formed. Thereafter, to completely remove the polyimide left on the contact portions, the structure is subjected to Descum process in which it is placed in a plasma atmosphere of $O_2$.

Subsequently, an aluminum (Al) layer of 1 to 2 μm thickness is deposited at 150° C., so as to entirely cover the image sensor, by the DC magnetron sputtering method. The aluminum layer is etched so as to form a desired pattern by photolithographic etching process using a mixed liquid of fluoric acid, nitric acid, phosphoric acid, and water. As a result of the etching process, in the photodetecting elements 11", a pattern of the wire portions to supply electric power to the metal electrodes 22 and a pattern of the wire portions 30a providing the connection from the transparent electrodes 24 to the lead portions 41' of the capacitors CCi,j are formed. In the additional capacitor CCi,j, a pattern of the upper metal layers 30 is formed. In the TFT, a pattern of the aluminum layers 30 as the light shield layers for the a-Si: H layer and a pattern of the aluminum layers covering the drain electrodes 41 are formed. In the wire group 13, a pattern of the common signal lines 14 connecting to the source electrodes 42 of the TFTs, and a pattern of the ground lines 43 are formed.

Finally, the structure is coated with polyimide to serve as a passivation layer, to approximately 2 to 4 μm thickness. The structure coated with polyimide is pre-baked at about 125° C., subjected to photolithographic etching process for patterning, and is further baked at about 230° C. for 90 minutes, forming the passivation layer. The resultant structure is subjected to the Descum process to remove the remaining polyimide. Thereafter, the drive ICs 15a, 15b and the like are mounted, and wire bonding and assembling work are performed to complete the image sensor.

The common signal lines 14 entirely made of aluminum (Al) are patterned so that they meander through the photodetecting element array 11 in a zig-zag fashion, while being connected at specific points to the source electrodes 42 of the TFTs. Accordingly, the resistance of the common signal lines may be reduced.

In the method of manufacturing the image sensor according to the instant embodiment of the present invention, the gate electrodes 25 of the thin film transistor switching elements of the charge transfer section 12, the lower metal layers 44' of the additional capacitors CCi,j, and the wires 44 to the earth lines are formed on the substrate, by the metal layer of the chromium (Cr1) layer. The metal electrodes 22 of the photodetecting elements 11", the lead portions 41' as the conductive layers of the additional capacitors CCi,j, the source electrodes 42 of the thin film transistor switching elements, and the drain electrodes 41 are formed by the same metal layer of the chromium (Cr2) layer. The upper metal layers 30' of the additional capacitors CCi,j, the aluminum layers 30 of the light shield metal layers of the thin film transistor switching elements, the common signal line portions 14 of the wire groups 13, and the ground lines 43 each disposed between the adjacent signal lines, are formed by the same metal layer of the aluminum layer. Therefore, the method of manufacturing the image sensor according to the instant embodiment of the present invention can efficiently manufacture the image sensor formed with the photodetecting elements 11", thin film transistor switching elements in the charge transfer section 12, the additional capacitors Ci,j, the wire group 13, and the like.

The gate electrodes 25 of the TFT switching elements and the lower metal layers 44' of the additional capacitors CCi,j may be made of tantalum (Ta) or titanium (Ti), in place of chromium. The metal electrodes 22 of the photodetecting elements 11", the lead portions 41' as the conductive layers of the additional capacitors CCi,j, the source electrodes 42 and the drain electrodes 41 of the TFT switching elements may also be made of tantalum (Ta) or titanium (Ti), in place of chromium. The photoconductive layers of the photodetecting elements 11" may be made of stannic oxide ($SnO_2$), in place of ITO. The upper metal electrodes 30, of the additional capacitors CCi,j and the wire group 13 are formed by the aluminum layers, but those may be formed with a metal layer of a double-layered structure consisting of a lower layer of molybdenum (Mo) and an upper layer of aluminum (Al).

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An image sensor comprising:
   a photodetecting element array including a plurality of blocks linearly arrayed in a main scan direction, each block comprising a plurality of photodetecting elements;
   a plurality of switching elements for transferring block charges generated in the plurality of photodetecting elements; and
   drive means for outputting the block charges as image signals;
   wherein the switching elements in a first block of the photodetecting element array and the switching elements in a second block of the photodetecting element array, located adjacent to the first block, are connected by first wires so that adjacent switching elements of first and second blocks are interconnected as a first coupled pair, the switching elements adjacent to the first coupled pair are interconnected as a second coupled pair, and wherein second wires connecting the switching elements in the first block to the switching elements in blocks adjacent to the first block are disposed perpendicular to the main scan direction, and are disposed so that a first wiring of the second wires, connecting the first coupled pair, is located adjacent to the photodetecting element array and, a second wiring of the second wires, connecting the second coupled pair is located adjacent to the first wiring.

2. An image sensor comprising:
   a plurality of photodetecting element arrays arranged in a subsidiary scan direction, each array including a plurality of blocks linearly arrayed in a main scan direction, each block comprising a plurality of photodetecting elements;

a plurality of switching elements arranged in rows for transferring block charges generated in the plurality of photodetecting elements; and drive means for outputting the block charges as image signals, wherein switching elements of a first row and switching elements of a second row are connected by common wires in each of the plurality of blocks, the common wires being connected so that the switching elements of adjacent blocks which are adjacent to each other are interconnected as a first coupled pair, the switching elements adjacent to the first coupled pair are interconnected as a second coupled pair, and wherein the common wires connecting the switching elements of the photodetecting element array of a first block and the common wires connecting the switching elements of the photodetecting element array of a second block, which is adjacent to the first block and aligned therewith in the subsidiary scan direction, are disposed perpendicular to the main scan direction, and are disposed so that a first wiring of the common wires connecting the first coupled pair is located adjacent to the photodetecting element array, and a second wiring of the wires connecting the second coupled pair is located adjacent to the first wiring.

3. An image sensor comprising:

a photodetecting element array including a plurality of blocks linearly arrayed in a main scan direction, each block comprising a plurality of photodetecting elements;

a plurality of switching elements for transferring block charges generated in the plurality of photodetecting elements; and drive means for outputting the charges as image signals, wherein the switching elements in a first block of the photodetecting element array and the switching elements in a second block of the photodetecting array, located adjacent to the first block, are connected by wires as signal lines so that adjacent switching elements of the first and second blocks are interconnected as a first coupled pair, the switching elements adjacent to the first coupled pair are interconnected as a second coupled pair, and wherein the signal lines connecting the switching elements in the first block to the switching elements in blocks adjacent to the first block are disposed perpendicular to the main scan direction, and are disposed so that the signal line connecting the first coupled pair is located adjacent to the photodetecting element array, the signal line connecting the second coupled pair is located adjacent to the first coupled pair and a wire set at a fixed potential is provided between the adjacent signal lines.

4. An image sensor comprising:

a photodetecting element array including a plurality of blocks linearly arrayed in a main scan direction, each block comprising a plurality of photodetecting elements;

a plurality of switching elements for transferring block charges generated in the plurality of photodetecting elements; and drive means for outputting the block charges as image signals, wherein the switching elements in a first block and the switching elements in a second block located adjacent to the first block are connected by wires as signal lines so that adjacent switching elements of the first and second blocks are interconnected as a first coupled pair, the switching elements adjacent to the first coupled pair are interconnected as a second coupled pair, and wherein the signal lines connecting the switching elements in the first block to the switching elements in blocks adjacent to the first block are disposed perpendicular to the main scan direction, and are disposed so that the signal line connecting the first coupled pair is located adjacent to the photodetecting element array, the signal line connecting the second coupled pair is located adjacent to the the first coupled pair, a first wire, set at a fixed potential, is provided between the adjacent signal lines, and a second wire, set a fixed potential, is provided in an area apart from the photodetecting element array.

5. An image sensor comprising:

a photodetecting element array including a plurality of blocks linearly arrayed in a main scan direction, each block comprising a plurality of photodetecting elements, each photodetecting element having upper and lower electrode layers;

a plurality of switching elements for transferring block charges generated in the plurality of photodetecting elements; and a plurality of wires, connected to the plurality of switching elements, for outputting the charges in the form of image signals, wherein the plurality of wires lie between adjacent photodetecting elements in the photodetecting element array, and a portion of each of the wires is formed of a metal layer located above the upper and lower electrode layers forming each photodetecting element.

6. An image sensor comprising:

a photodetecting element array including a plurality of blocks linearly arrayed in a main scan direction, each block comprising a plurality of photodetecting elements, each photodetecting element having upper and lower electrode layers;

a plurality of switching elements for transferring block charges generated in the plurality of photodetecting elements; and a plurality of wires, connected to the plurality of switching elements, for outputting the block charges as image signals, wherein the plurality of wires lie between adjacent photodetecting elements in the photodetecting element array, and a portion of each of the wires is formed of a metal layer located below the upper and lower electrode layers forming each photodetecting element.

* * * * *

UNITED STATES PATENT AND TRADEMARK OFFICE
CERTIFICATE OF CORRECTION

PATENT NO. : 5,182,625
DATED : January 26, 1993
INVENTOR(S) : Hiroyuki Miyake et al.

It is certified that error appears in the above-identified patent and that said Letters Patent is hereby corrected as shown below:

Item [57
Abstract, Title Page, line 18, change "disclosed"
to --disposed--.

Claim 4, column 32, line 25, after "set" insert --at--.

Item [57]
Abstract, Title Page, line 21, change "next short"
to --next shortest--.

Signed and Sealed this

Eleventh Day of January, 1994

Attest:

BRUCE LEHMAN

*Attesting Officer*     *Commissioner of Patents and Trademarks*